(12) United States Patent
Zhang et al.

(10) Patent No.: US 12,713,711 B2
(45) Date of Patent: Aug. 18, 2026

(54) SOLAR CELL, METHOD OF MAKING, AND PHOTOVOLTAIC MODULE

(71) Applicant: ZHEJIANG JINKO SOLAR CO., LTD., Haining (CN)

(72) Inventors: Xinyu Zhang, Haining (CN); Huimin Li, Haining (CN); Menglei Xu, Haining (CN); Jie Yang, Haining (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 1 day.

(21) Appl. No.: 18/952,993

(22) Filed: Nov. 19, 2024

(65) Prior Publication Data

US 2025/0311470 A1 Oct. 2, 2025

(30) Foreign Application Priority Data

Mar. 26, 2024 (CN) ......................... 202410350449.4

(51) Int. Cl.
*H10F 10/14* (2025.01)
*H10F 19/80* (2025.01)
(Continued)

(52) U.S. Cl.
CPC ......... *H10F 10/146* (2025.01); *H10F 77/147* (2025.01); *H10F 77/227* (2025.01);
(Continued)

(58) Field of Classification Search
CPC .... H10F 10/146; H10F 77/147; H10F 77/227; H10F 19/80; H10F 19/908
See application file for complete search history.

(56) References Cited

U.S. PATENT DOCUMENTS

2009/0211628 A1 8/2009 Engelhart et al.
2017/0179325 A1 6/2017 Chung et al.
(Continued)

FOREIGN PATENT DOCUMENTS

CN 101673776 A 3/2010
CN 103531653 A 1/2014
(Continued)

OTHER PUBLICATIONS

English machine translation of TW 201440236A. (Year: 2014).*
(Continued)

*Primary Examiner* — Lindsey A Buck
(74) *Attorney, Agent, or Firm* — USCH Law, PC

(57) ABSTRACT

Disclosed are a solar cell, a method of making, and a photovoltaic module. The solar cell includes: a substrate, having a first surface and a second surface opposite to the first surface; multiple first doped portions, on the first surface; multiple second doped portions on the first surface; and multiple isolation trenches, each of which is formed between a respective first doped portion and an adjacent second doped portion. The isolation trenches each have opposing first sidewall and second sidewall that extend along a second direction, and at least one of the first sidewall and the second sidewall has a corrugated structure that undulates while extending along the first direction. The second direction intersects with the first direction. Embodiments of the present disclosure at least contribute to improving the photoelectric conversion efficiency of solar cells.

16 Claims, 10 Drawing Sheets

(51) Int. Cl.
*H10F 19/90* (2025.01)
*H10F 77/14* (2025.01)
*H10F 77/20* (2025.01)
*H10F 77/70* (2025.01)

(52) U.S. Cl.
CPC ............ *H10F 19/80* (2025.01); *H10F 19/908* (2025.01); *H10F 77/707* (2025.01)

(56) References Cited

U.S. PATENT DOCUMENTS

| | | | | |
|---|---|---|---|---|
| 2023/0352602 | A1 | 11/2023 | Zhang et al. | |
| 2024/0395960 | A1 * | 11/2024 | Li | H10F 77/219 |

FOREIGN PATENT DOCUMENTS

| | | | | |
|---|---|---|---|---|
| CN | 103915513 | A | 7/2014 | |
| CN | 113921625 | A * | 1/2022 | H10F 77/703 |
| CN | 115188857 | A | 10/2022 | |
| CN | 116417536 | A | 7/2023 | |
| CN | 117558765 | A | 2/2024 | |
| CN | 117594682 | A | 2/2024 | |
| CN | 117637874 | A | 3/2024 | |
| CN | 117637875 | A | 3/2024 | |
| CN | 117637876 | A | 3/2024 | |
| CN | 117727810 | A | 3/2024 | |
| CN | 117727822 | A | 3/2024 | |
| JP | 2013175634 | A | 9/2013 | |
| JP | 2014086708 | A | 5/2014 | |
| JP | 2016219544 | A | 12/2016 | |
| JP | 2019149444 | A | 9/2019 | |
| TW | 201440236 | A * | 10/2014 | |
| WO | 2008156009 | A1 | 12/2008 | |

OTHER PUBLICATIONS

Xuetao Pan, “Femtosecond laser microdevice preparation quality optimization technology research”, Jiangsu University Press, Jul. 31, 2020, P70-72, 5 pgs.

Zhejiang Jinko Solar Co., Ltd., CN First Office Action with English translation, CN 2024103504494, May 10, 2024, 21 pgs.

Zhejiang Jinko Solar Co., Ltd., The Second Office Action with English translation, CN 2024103504494, Jun. 4, 2024, 19 pgs.

Zhejiang Jinko Solar Co., Ltd., The Third Office Action with English translation, CN 2024103504494, Aug. 8, 2024, 23 pgs.

Zhejiang Jinko Solar Co., Ltd., European Search Report, EP24213813.9, May 6, 2025, 11 pgs.

* cited by examiner

SOLAR CELL, METHOD OF MAKING, AND PHOTOVOLTAIC MODULE

CROSS REFERENCE TO RELATED APPLICATIONS

The present application claims the benefit of priority under the Paris Convention to Chinese Patent Application No. 202410350449.4, filed on Mar. 26, 2024, which is incorporated herein by reference in its entirety.

TECHNICAL FIELD

Embodiments of the present disclosure relates to the technical field of photovoltaic, and in particular to, a solar cell, a method of making, and a photovoltaic module.

BACKGROUND

Interdigitated back contact (IBC) cell refers to a type of solar cell structure with back junction and back contact in which the positive and negative metal electrodes are alternatingly arranged in an interdigitated pattern on the back surface of the cell. The back junction refers to the PN junctions being located on the backlight surface of the cell. Since the PN junctions and metal electrodes of the IBC cell are both located on the back surface of the cell, the front surface is not shield by the metal electrodes, and an exceptionally high short-circuit current and conversion efficiency can be achieved. However, it is desired to improve the structure of conventional IBC cells requires improvement to enhance the photoelectric conversion efficiency of the IBC cell.

SUMMARY

Embodiments of the present disclosure provide a solar cell, a method of making, and a photovoltaic module, which at least contribute to improving the photoelectric conversion efficiency of solar cells.

Some embodiments of the present disclosure provide a solar cell, including: a substrate, having a first surface and a second surface opposite to the first surface; a plurality of first doped portions, on the first surface; a plurality of second doped portions on the first surface, where the plurality of second doped portions and the plurality of first doped portions are alternatingly distributed on the first surface along a first direction, and doping elements in the plurality of second doped portions and doping elements in the plurality of first doped portions are of different types; and a plurality of isolation trenches, each of which is formed between a respective first doped portion of the plurality of first doped portions and an adjacent second doped portion, where the plurality of isolation trenches each have opposing first sidewall and second sidewall extending along a second direction, and at least one of the first sidewall and the second sidewall has a corrugated structure that undulates while extending along the second direction, and the second direction intersects with the first direction.

In some embodiments, the corrugated structure has a maximum width in the first direction that is less than or equal to 15 μm.

In some embodiments, at least one of the first sidewall and the second sidewall is correspondingly transitioned to a top surface of the first doped portion or a top surface of the second doped portion with a rounded corner.

In some embodiments, a ratio of a height of the rounded corner along a thickness direction of the substrate to a height of the first sidewall along the thickness direction of the substrate is greater than 0 and less than or equal to 3:20.

In some embodiments, the corrugated structure includes grooves and ridges alternating along the second direction, where a respective ridge of the ridges abuts on two adjacent grooves of the grooves; and a tangent line of the respective ridge extending along a direction perpendicular to the second direction includes an angle of 45° to 90° with the first direction.

In some embodiments, each isolation trench has a bottom surface, the bottom surface includes a first region, a second region, and a third region disposed sequentially along the first direction; where in the thickness direction of the substrate, a second distance is less than a first distance and a second distance is less than a third distance; where the first distance is a distance between the bottom surface of the isolation trench corresponding to the first region and the second surface, the second distance is a distance between the bottom surface of the isolation trench corresponding to the second region and the second surface, and the third distance is a distance between the bottom surface of the isolation trench corresponding to the third region and the second surface.

In some embodiments, the first sidewall and the second sidewall each have the corrugated structure extending along the second direction.

Some embodiments of the present disclosure provide a method of making, including: providing a substrate, where the substrate has a first surface and a second surface which are opposite to each other; forming, on the first surface, a plurality of first doped portions distributed at intervals along a first direction; forming, on the first surface, a plurality of initial second doped portions distributed at intervals along the first direction, where each of the plurality of initial second doped portions includes a first sub-doped portion and a second sub-doped portion, the second sub-doped portion is located on two opposite sides of the first sub-doped portion along the first direction, and is located between a respective one of the plurality of first doped portions and the first sub-doped portion, and doping elements in the plurality of initial second doped portions and doping elements in the plurality of first doped portions are of different types; performing laser treatment on each of the plurality of initial second doped portions to remove at least the second sub-doped portion and form an isolation trench between the remaining first sub-doped portion and an adjacent one of the plurality of first doped portions, where the isolation trench exposes the first surface, and the remaining first sub-doped portion serves as a second doped portion, where the isolation trench has opposing first sidewall and second sidewall that extend along a second direction, and at least one of the first sidewall and the second sidewall has a corrugated structure that undulates while extending along the second direction; where the laser treatment includes: scanning a top surface of the plurality of second sub-doped portions with a plurality of first laser beams and a plurality of second laser beams, where the plurality of first laser beams are used for scanning the top surface of the corresponding plurality of second sub-doped portions in the first direction, and the plurality of second laser beams are used for scanning a preset region in the second direction, where the preset region at least includes a part of the top surface of the corresponding plurality of first doped portions adjacent to the plurality of second sub-doped portions in the plurality of initial second doped portions, and the second direction is parallel to a side surface of each of the plurality of second sub-doped portions facing the respective one of the plurality of first doped portions.

In some embodiments, a power of each of the plurality of first laser beams ranges from 25 W to 35 W, and a power of each of the plurality of second laser beams ranges from 25 W to 35 W.

In some embodiments, a duration for the plurality of first laser beams to scan the top surface of the corresponding plurality of second sub-doped portions in the first direction is defined as first processing time, a duration for the plurality of second laser beams to scan the preset region in the second direction is defined as second processing time, and a ratio of the first processing time to the second processing time ranges from 1 to 70.

In some embodiments, the corrugated structure includes grooves and ridges alternating along the second direction, where a respective ridge of the ridges abuts on two adjacent grooves of the grooves; the laser treatment includes a first laser treatment and a second laser treatment which are sequentially executed; during the first laser treatment, at least two of the plurality of first laser beams scan the preset region along the first direction, and at least one of the plurality of second laser beams scans the preset region along the second direction, a light spot of the at least two of the plurality of first laser beams projected onto the preset region is defined as first light spot, and a light spot of the at least one of the plurality of second laser beams projected onto the preset region is defined as second light spot, where an overlapping part of the first and second light spots is used for removing a corresponding part of the second sub-doped portion of the preset region and for removing a part of the first doped portion adjacent to the preset region, to form the grooves, and a part of the first light spot that does not overlap with the second light spot is used for removing the corresponding second sub-doped portion, to form the ridges; during the second laser treatment, a plurality of first laser beams are used for scanning the top surface of the remaining second sub-doped portion, so as to remove the remaining second sub-doped portion and form the isolation trench.

In some embodiments, each of the plurality of second sub-doped portions includes a first portion and two second portions respectively located on opposite sides of the first portion along the first direction; the laser treatment includes: removing the first portion, the two second portions, and a part of the substrate corresponding to a bottom surface of the first portion.

In some embodiments, during the laser treatment, a plurality of first laser beams are used for scanning the top surface of the corresponding plurality of second sub-doped portions in the first direction; where light spots of adjacent first laser beams projected onto the top surface of the corresponding plurality of second sub-doped portions partially overlap with each other.

In some embodiments, each of the plurality of second sub-doped portions includes a first portion and two second portions respectively located on opposite sides of the first portion along the first direction, and the preset region includes a top surface of the two second portions in a respective one of the plurality of initial second doped regions; the first and second sidewalls of the isolation trench formed in the laser treatment each have the corrugated structure extending along the second direction.

Some embodiments of the present disclosure further provide a photovoltaic module, including: a cell string, formed by connecting the solar cell according to any one of the precedent embodiments, or by connecting the solar cell manufactured by the manufacturing method according to any one of the precedent embodiments; an encapsulation layer, configured for covering a surface of the cell string; and a cover plate, configured for covering a surface of the encapsulation layer facing away from the cell string.

The technical solution provided in the embodiments of the present disclosure has at least the following advantages.

In the solar cell provided by the embodiments of the present disclosure, at least one sidewall of each isolation trench has the corrugated structure extending along the second direction, and the corrugated structure undulates in the first direction, so that the sidewall having the corrugated structure possesses a large surface area, and the large surface area helps to improve the absorption rate of incident light by the solar cell, thereby improving the photoelectric conversion efficiency of the solar cell. Furthermore, from the perspective of process preparation, with the operation of forming the isolation trench by removing a part of the second doped portion adjacent to the first doped portion as an example, forming the isolation trench also requires to remove a part of the first doped portion adjacent to the second doped portion, to form the isolation trench. In this way, a part of the first doped portion containing the doping element from the second doped portion can be removed, preventing the part of the first doped portion containing the doping element from the second doped portion from affecting the normal use of other portions of the first doped portion. Moreover, the process of removing a part of the first doped portion or a part of the second doped portion is taken as a first process, and the formation of the isolation trench with at least one sidewall having a corrugated structure imposes lower precision requirements on the first process, as compared to an isolation trench with sidewalls that are flat and without undulations, which helps to reduce process difficulty.

BRIEF DESCRIPTION OF THE DRAWINGS

One or more embodiments are illustrated through the figures in the corresponding drawings. These exemplary illustrations do not constitute limitations on the embodiments unless otherwise stated. The figures in the accompanying drawings do not constitute a scale limitation. In order to illustrate the technical solutions in the embodiments of the present disclosure or in the conventional technology more clearly, the drawings used in the description of the embodiments are briefly described below. It is apparent that the drawings in the following description show only some embodiments of the present disclosure, and other drawings may be obtained by those of ordinary skill in the art based on these drawings without any creative efforts.

DETAILED DESCRIPTION OF THE EMBODIMENTS

Figure 1:
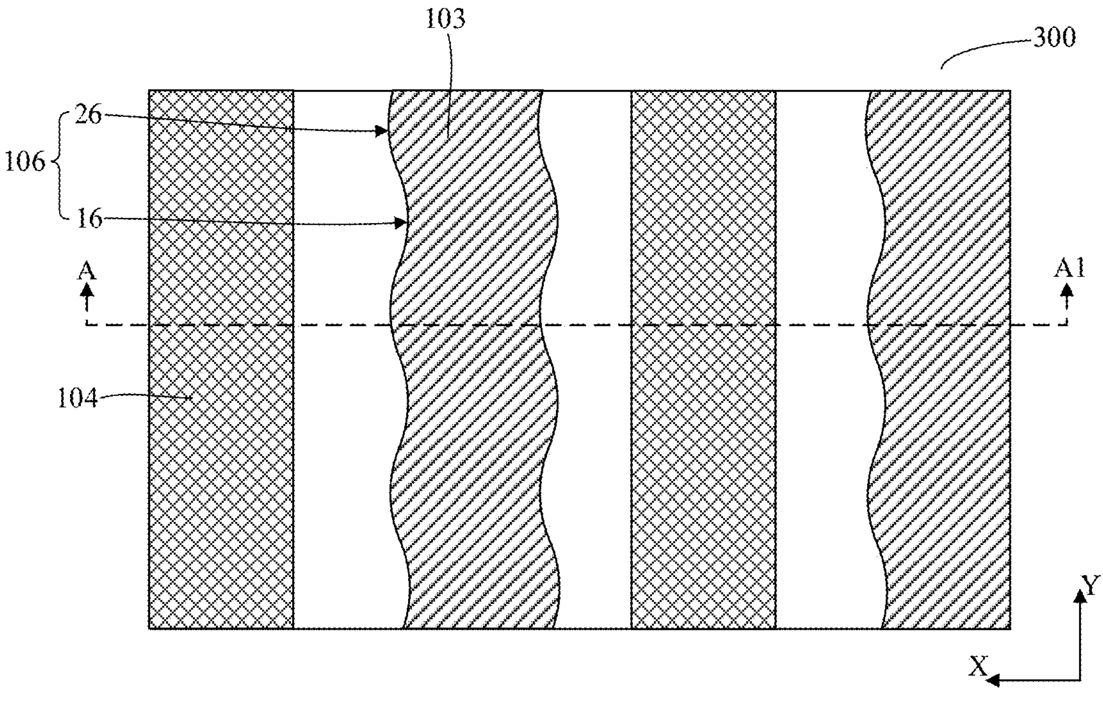
FIG. 1 shows a top view of a first type of solar cell provided in an embodiment of the present disclosure.

As is known from the background technology, the structure of current solar cells requires improvement.

Embodiments of the present disclosure provide a solar cell, in which one isolation trench is formed between a respective first doped portion of the plurality of first doped portions and an adjacent second doped portion, at least one sidewall of each isolation trench has a corrugated structure extending along a second direction, and the corrugated structure undulates in a first direction, so that the sidewall having the corrugated structure possesses a large surface area. A large surface area helps to improve the absorption rate of incident light by the solar cell, thereby improving the photoelectric conversion efficiency of the solar cell. Furthermore, from the perspective of process preparation, with the operation of forming the isolation trench by removing a part of the second doped portion adjacent to the first doped portion as an example, forming the isolation trench also requires to remove a part of the first doped portion adjacent to the second doped portion, to form the isolation trench. In this way, a part of the first doped portion containing the doping element from the second doped portion can be removed, preventing the part of the first doped portion containing the doping element from the second doped portion from affecting the normal use of other portions of the first doped portion. Moreover, the process of removing a part of the first doped portion or a part of the second doped portion is taken as a first process, and the formation of the isolation trench with at least one sidewall having a corrugated structure imposes lower precision requirements on the first process, as compared to an isolation trench with sidewalls that are flat and without undulations, which helps to reduce process difficulty.

To further clarify the objectives, technical solutions, and advantages of the embodiments of the present disclosure, specific technical solutions of the embodiments of the present disclosure are described in further detail in conjunction with the accompanying drawings in the embodiments of the present disclosure. The following embodiments are used for illustrating the present disclosure rather than limiting the scope of the present disclosure.

As used in this paper, features (for example, regions, structures, devices) described as “adjacent” imply and encompass features that are located closest to each other (for example, the nearest) and possess one or more disclosed identifiers. One or more additional features with disclosed identifiers (for example, additional regions, structures, or devices) that do not match the “adjacent” features may be disposed between the “adjacent” features. In other words, the “adjacent” features may be located directly next to each other with no other features intervening between the “adjacent” features; or the “adjacent” features may be located indirectly next to each other, such that at least one feature with an identifier other than that associated with at least one “adjacent” feature is positioned between the “adjacent” features. Therefore, the features described as “vertically adjacent” to each other imply and encompass the features disclosed by one or more identifiers and located vertically closest to each other (for example, vertically nearest). Furthermore, the features described as “horizontally adjacent” to each other imply and encompass the features disclosed by one or more identifiers and located horizontally closest to each other (for example, horizontally nearest).

In the following description, the description that a second component is formed or disposed above or on a first component, or a second component is formed or disposed on a surface of a first component, or a second component is formed or disposed on one side of the first component, may encompass embodiments in which the first and second components are in direct contact, and may also encompass embodiments in which additional components may be disposed between the first and second components and the first and second components are therefore in indirect contact. For simplicity and clarity, various components may be drawn at any scale. In the accompanying drawings, some layers/components may be omitted for simplicity.

Unless otherwise specified, the description that a second component is formed or disposed on a surface of a first component implies that the first component is in direct contact with the second component.

The aforementioned “component” may refer to layer, film, region, part, or structure.

Furthermore, for ease of description, spatial relative terms such as “under,” “below,” “lower,” “above,” and “upper” may be used herein to describe the relationship between one component or part and another component(s) or part(s) as illustrated in the drawings. In addition to the orientations depicted in the drawings, the spatial relative terms are intended to encompass various orientations of devices during use or operation. In the case that devices are oriented in other ways (rotated by 90 degrees or positioned in other orientations), the spatial relative terms used herein still be applied accordingly. Additionally, the expression “made of”

may signify "comprising" or "composed of". Furthermore, in the subsequent manufacturing process, one or more additional operations may be performed during/between the described operations, and the sequence of operations may vary. In the following embodiments, the terms "upper", "above", and/or "over" are defined as a direction in which a distance from the front surface and the rear surface increases. The materials, configurations, dimensions, processes, and/or operations described in the illustrated embodiments may be adopted in other embodiments, and detailed descriptions thereof may be omitted.

As used in this paper, unless otherwise explicitly indicated by the context, the singular form "a/an" and "the" are intended to encompass the plural form as well.

As used in this paper, the term "and/or" encompasses any and all combinations of one or more of the listed items associated with each other.

Unless otherwise indicated by the context, the materials described herein may be formed by any suitable technique, including but not limited to spin coating, blanket coating, chemical vapor deposition (CVD), plasma-enhanced CVD (PECVD), atomic layer deposition (ALD), plasma-enhanced ALD (PEALD), physical vapor deposition (PVD) (such as sputtering), or epitaxial growth. The technique used for depositing or growing the specified material depends on the material to be formed, and can be selected by those of ordinary skill in the art. Additionally, unless otherwise indicated by the context, the material removal described herein may be achieved through any suitable technique, including but not limited to etching (for example, dry etching, wet etching, and vapor phase etching), ion milling, grinding and planarization (for example, chemical mechanical planarization (CMP)) or other known methods.

The term "semiconductor" used in this paper may refer to, for instance, material layers, bases, wafers, or substrates, and encompasses any substrate semiconductor structure. The term "semiconductor" should be understood to encompass technologies such as Silicon on Sapphire (SOS), Silicon on Insulator (SOI), Thin-Film Transistor (TFT), doped and undoped semiconductors, epitaxial silicon layers supported by a substrate semiconductor structure, as well as other semiconductor structures widely known to those skilled in the art. Furthermore, when referring to semiconductors in the following description, regions/junctions may be already formed within the substrate semiconductor structure through prior process steps, and the term "semiconductor" may encompass the substrate layer that contains such regions/junctions.

The following provides a detailed description of the various embodiments of the present disclosure in conjunction with the accompanying drawings. However, those of ordinary skill in the art may understand that in various embodiments of the present disclosure, many technical details have been presented to facilitate a better understanding of the present disclosure by the reader. However, even without these technical details and the various variations and modifications based on the following embodiments, the technical solution claimed in the present disclosure can still be achieved.

Figure 2:
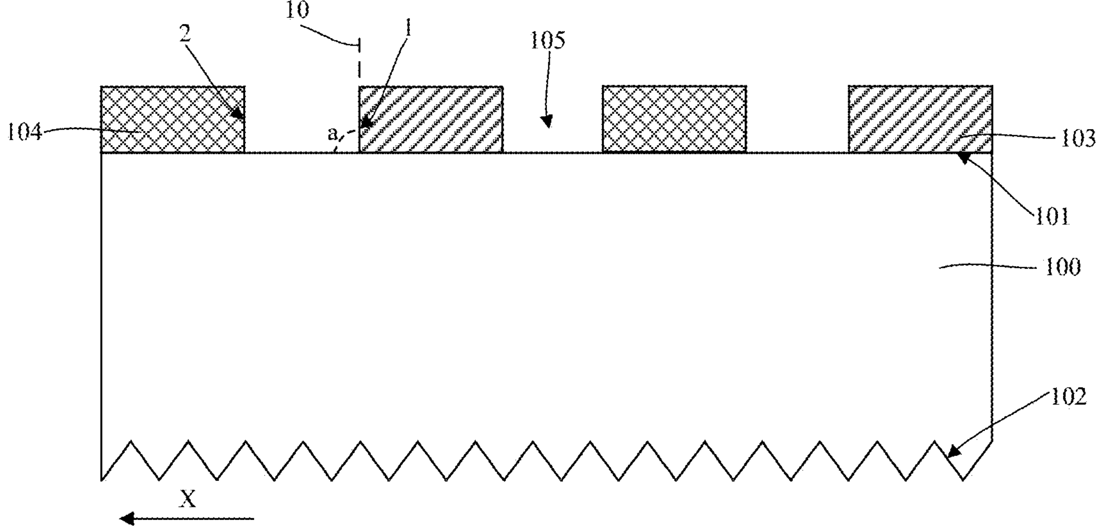
FIG. 2 shows a cross-sectional view of the first type of solar cell sectioned along line AA1 in FIG. 1, as provided in an embodiment of the present disclosure.

FIG. 1 shows a top view of a first type of solar cell provided in an embodiment of the present disclosure; and FIG. 2 shows a cross-sectional view of the solar cell sectioned along line AA1 in FIG. 1.

Referring to FIG. 1 and FIG. 2, the solar cell includes: a substrate 100 having a first surface 101 and a second surface 102 opposite to the first surface 101. The solar cell includes a plurality of first doped portions 103, on the first surface 101. The solar cell includes a plurality of second doped portions 104 on the first surface 101. The plurality of second doped portions 104 and the plurality of first doped portions 103 are alternatingly distributed on the first surface 101 along a first direction X, and doping elements in the plurality of second doped portions 104 and doping elements in the plurality of first doped portions 103 are of different types. The solar cell includes isolation trenches 105. Each of the isolation trenches 105 is formed between a respective first doped portion 103 of the plurality of first doped portions 103 and an second doped portion 104. Each isolation trench 105 has opposing first sidewall 1 and second sidewall 2 that extend along a second direction, and at least one of the first sidewall 1 and the second sidewall 2 has a corrugated structure 106 that undulates while extending along the second direction Y, and the second direction Y intersects with the first direction X.

It should be noted that the following is explained with the first sidewall 1 in FIG. 1 having the corrugated structure 106 as an example.

The sidewall of each isolation trench 105 having the corrugated structure 106 possesses a large surface area, and the large surface area helps to improve the absorption rate of incident light by the solar cell, thereby improving the photoelectric conversion efficiency of the solar cell. Furthermore, from the perspective of process preparation, with the operation of forming the isolation trench 105 by removing a part of the second doped portion 104 adjacent to the first doped portion 103 as an example, forming the isolation trench 105 also requires to remove a part of the first doped portion 103 adjacent to the second doped portion 104, to form the isolation trench 105. In this way, a part of the first doped portion 103 containing the doping element from the second doped portion 104 can be removed, preventing the part of the first doped portion 103 containing the doping element from the second doped portion 104 from affecting the normal use of other portions of the first doped portion 103. Moreover, the process of removing a part of the first doped portion 103 or a part of the second doped portion 104 is taken as a first process, and the formation of the isolation trench 105 with at least one sidewall having a corrugated structure 106 imposes lower precision requirements on the first process, as compared to an isolation trench 105 with sidewalls that are flat and without undulations, which helps to reduce process difficulty. For instance, the first process may be laser treatment. The formation of the isolation trench 105 with at least one sidewall having the corrugated structure 106 imposes less strict requirements on the shape and size of light spot for laser treatment, as compared to an isolation trench 105 with sidewalls that are flat and without undulations. For another instance, the first process may be wet etching. With the formation of the isolation trench 105 requiring the removal of a part of the second doped portion 104 adjacent to the first doped portion 103 as an example, temporal control requirements for the first process are less stringent, since the formation of the isolation trench 105 also removes a part of the first doped portion 103 adjacent to the second doped portion 104.

The substrate 100 is configured to receive incident light and generate photogenerated carriers. In some embodiments, the substrate 100 may be a semiconductor substrate 100, such as silicon, germanium, germanium silicon, or silicon on insulator.

In some embodiments, the material of the substrate 100 may be a material of an element semiconductor. Specifically, the material of an element semiconductor consists of a single element, such as silicon or germanium. The material of an element semiconductor may exist in single crystal, polycrystalline, amorphous, or microcrystalline states (which has both the single crystal state and the amorphous state). For instance, silicon may be at least one of single crystal silicon, polycrystalline silicon, amorphous silicon, or microcrystalline silicon. If the material of the substrate 100 is silicon, the material of the substrate 100 may include at least one of single crystal silicon, polycrystalline silicon, amorphous silicon, or microcrystalline silicon.

In some embodiments, the material of the substrate 100 may be a material of a compound semiconductor. The material of a common compound semiconductor includes, but is not limited to, silicon germanide, silicon carbide, gallium arsenide, gallium indium compound, perovskite, cadmium telluride, and copper indium selenide, or may also be silicon carbide or organic material.

The substrate 100 may also be a sapphire substrate, a silicon substrate on insulator, or a germanium substrate on insulator.

The substrate 100 may be an N-type semiconductor substrate or a P-type semiconductor substrate. The N-type semiconductor substrate is doped with N-type doping elements, which may be any one of the group 5 elements such as phosphorus (P), bismuth (Bi), antimony (Sb), or arsenic (As). The P-type semiconductor substrate 100 is doped with P-type elements, which may be any one of the group 3 elements such as boron (B), aluminum (Al), gallium (Ga), or indium (In).

In some embodiments, the solar cell is a monofacial cell, with the second surface 102 of the substrate 100 serving as a light-receiving surface to receive incident light, and the first surface 101 of the substrate 100 serving as a back surface. In some embodiments, the solar cell is a bi-facial cell, with both the first surface 101 and the second surface 102 of the substrate 100 serving as light-receiving surfaces.

In some embodiments, the second surface 102 of the substrate 100 possesses a textured structure which may include a regularly pyramid-shaped textured structure and irregularly shaped black silicon. The inclined surface of the textured structure enhances the internal reflection of incident light, thereby improving the absorption and utilization rate of the incident light by the substrate 100, and consequently improving the cell efficiency of solar cells.

In some embodiments, the second surface 102 of the substrate 100 has a layer of front surface field (FSF) (not shown), where the conductivity type of the doping elements of the FSF is identical to that of the substrate 100. FSF utilizes the field passivation effect to reduce the concentration of minority carriers of the surface, thereby decreasing the surface recombination velocity, reducing the series resistance and improving the electron transport capability.

Figure 3:
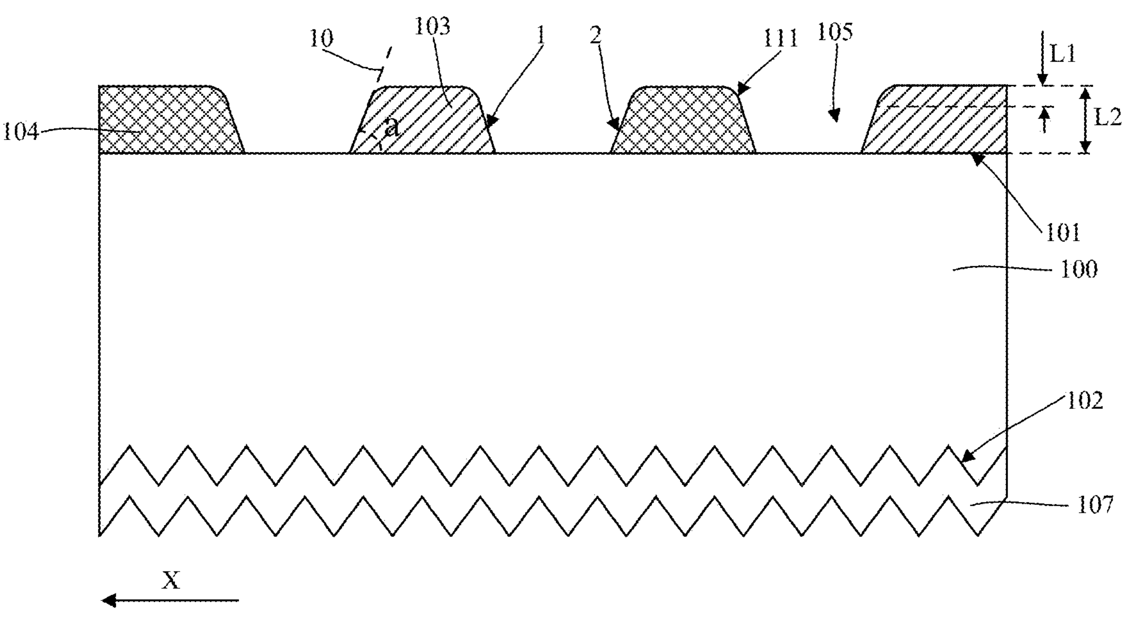
FIG. 3 shows a structural view of a second type of solar cell provided in an embodiment of the present disclosure.

FIG. 3 shows a cross-sectional view of a second type of solar cell sectioned along line AA1 (see FIG. 1), as provided in an embodiment of the present disclosure.

Referring to FIG. 3, in some embodiments, the solar cell includes: a first passivation layer 107 located on the second surface 102. The first passivation layer 107 may be a single-layer structure or a laminated structure. The material of the first passivation layer 107 may be one or more of silicon oxide, silicon nitride, silicon oxynitride, silicon carbon oxynitride, titanium oxide, hafnium oxide, and aluminum oxide.

In some embodiments, the first surface 101 of the substrate 100 is a polished surface. A polished surface refers to a flat surface formed by removing the facial textured structure through a polishing solution or laser etching. After polishing, the flatness of the first surface 101 is improved, leading to an increase in reflection of long-wave light, promoting the secondary absorption of the incident light, and thereby improving the short-circuit current. Moreover, the specific surface area of the first surface 101 is also reduced, thereby reducing the recombination of the first surface and improving the passivation effect on the back surface. In some embodiments, the first surface 101 of the substrate 100 may also have a textured structure.

In the embodiments of the present disclosure, one second doped portion 104 is distributed between any two adjacent first doped portions 103, and one first doped portion 103 is distributed between any two adjacent second doped portions 104.

Each first doped portion 103 is doped with N-type doping elements or P-type doping elements, while each second doped portion 104 is doped with P-type doping elements or N-type doping elements. The type of doping element in the first doped portions 103 or the second doped portions 104 is the same as that of the doping element in the substrate 100. For example, the substrate 100 is an N-type substrate 100, the first doped portions 103 may be doped with N-type doping elements, while the second doped portions 104 may be doped with P-type doping elements. Thus, the second doped portions 104 form PN junctions with the substrate 100, effectively shunting carriers.

Figure 4:
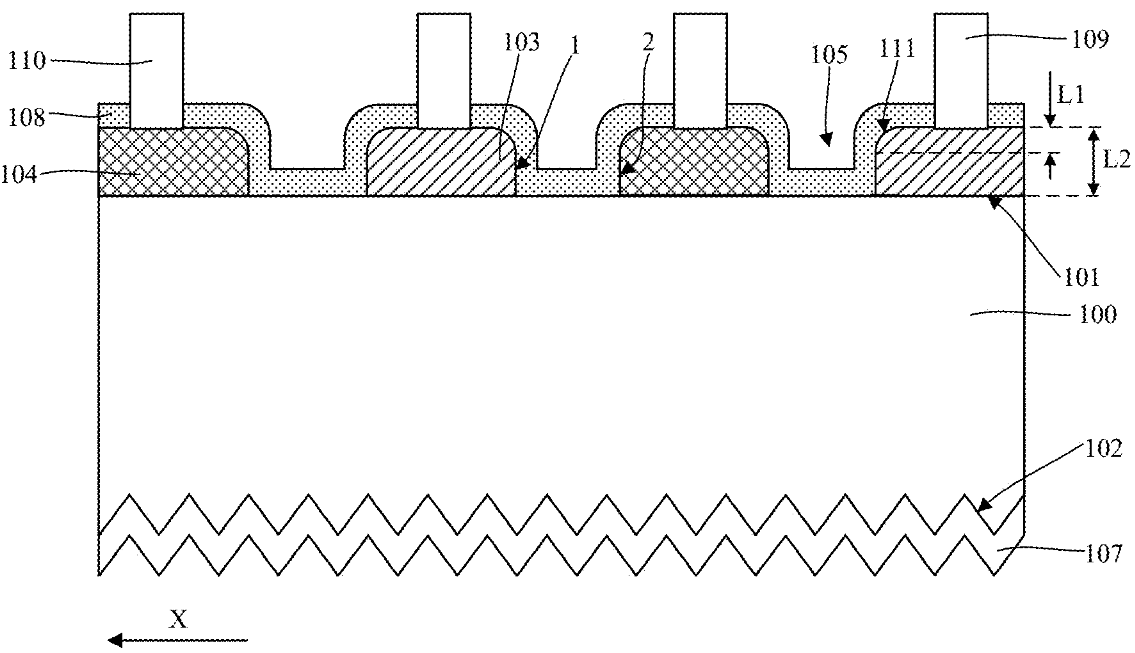
FIG. 4 shows a structural view of a third type of solar cell provided in an embodiment of the present disclosure.
Figure 5:
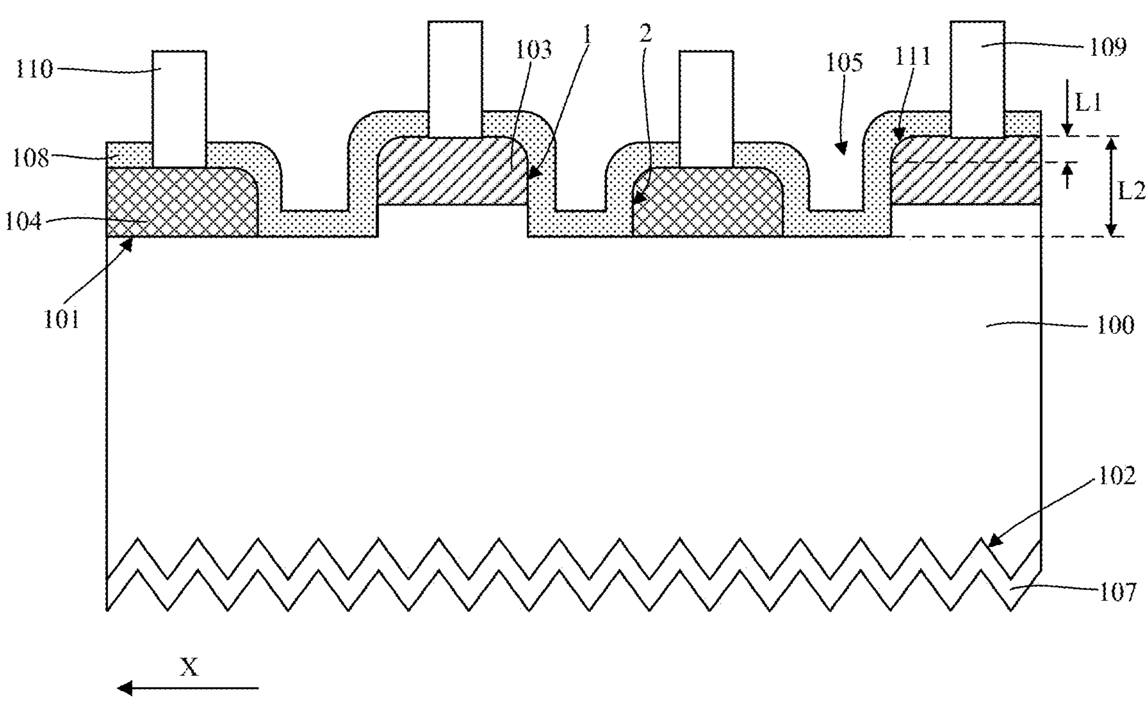
FIG. 5 shows a structural view of a fourth type of solar cell provided in an embodiment of the present disclosure.

In this embodiment, the type of doping element in the first doped portions 103 is the same as that of the doping element in the substrate 100. The concentration of the doping element within the first doped portions 103 is greater than that in the substrate 100, forming high-low junctions between the first doped portions 103 and the substrate 100, and enhancing the separation capability of the carriers. Referring to FIG. 4, FIG. 4 shows a structural view of a third type of solar cell provided in an embodiment of the present disclosure, where the bottom surface of the first doped portions 103 is flush with the bottom surface of the second doped portions 104. Alternatively, referring to FIG. 5, FIG. 5 shows a structural view of a fourth type of solar cell provided in an embodiment of the present disclosure, where the bottom of each of the first doped portions 103 facing the substrate is higher than the top of any of the second doped portions 104 facing away from the substrate. It should be noted that the embodiments of the present disclosure do not specifically limit the positional relationship of the first doped portions 103 and the second doped portions 104 along the thickness direction of the substrate 100. It suffices that adjacent first doped portion 103 and second doped portion 104 are separated by the isolation trench 105.

The bottom surface of the first doped portions 103 is the surface, facing towards the substrate 100, of the first doped portions 103. The bottom surface of the second doped portions 104 is the surface, facing towards the substrate 100, of the second doped portions 104. The top surface of the first doped portions 103 is the surface, facing away from the substrate 100, of the first doped portions 103. The top surface of the second doped portions 104 is the surface, facing away from the substrate 100, of the second doped portions 104.

In some embodiments, the solar cell further includes: tunneling layers (not shown) located between the first doped portions 103 and the substrate 100, as well as between the second doped portions 104 and the substrate 100. The tunneling layers cause an asymmetric shift in the energy band of the first surface 101 of the substrate 100, so that a potential barrier for the majority carriers is lower than that for the minority carriers. Consequently, the majority carriers can more readily undergo quantum tunneling through the tunneling layer to be transported to the first doped portions 103 or the second doped portions 104, while the minority carriers have a great difficulty in passing through the tunneling layer, thereby achieving selective transport of the carriers. Furthermore, the tunneling layer also serves to chemically passivate the first surface 101 of the substrate 100.

Referring to FIG. 4 and FIG. 5, in some embodiments, the solar cell includes: a second passivation layer 108 located on the first doped portions 103 and the second doped portions 104 and covering the first sidewall 1, the second sidewall 2, the bottom surface of the isolation trenches 105. Since at least one of the first sidewall 1 and the second sidewall 2 has the corrugated structure 106, the surface area of the sidewall with the corrugated structure 106 is large. Consequently, the contact area between the second passivation layer 108 and the sidewall of the isolation trench 105 is large, which enhances the passivation effect of the second passivation layer 108 on the first doped portion 103 or the second doped portion 104 corresponding to the sidewall with the corrugated structure 106.

The second passivation layer 108 may be a single-layer film structure or a laminated film structure. The material of the second passivation layer 108 may be any one or any combination of silicon oxide, silicon nitride, silicon oxynitride, silicon carbon oxynitride, titanium oxide, hafnium oxide, and aluminum oxide.

The solar cell includes: a first electrode 109 penetrating through the second passivation layer 108 and electrically connected to the first doped portions 103; and a second electrode 110 penetrating through the second passivation layer 108 and electrically connected to the second doped portions 104.

The first electrode 109 and the second electrode 110 serve as the conductive finger (thin finger) of the solar cell, and are used for collecting and aggregating the current from the solar cell. The first electrode 109 and the second electrode 110 may be formed by sintering a fire-through paste. The material of the first electrode 109 and the second electrode 110 may be one or more of aluminum, silver, gold, nickel, molybdenum, or copper.

In some embodiments, the solar cell further includes antireflection layers (not shown). The antireflection layers are respectively located on a side, away from the first surface 101, of the second passivation layer 108 and on a side, away from the substrate 100, of the first passivation layer 107. The first electrode 109 penetrates through the antireflection layer and the second passivation layer 108, and is in electrical contact with the surface of the first doped portions 103. Similarly, the second electrode 110 penetrates through the antireflection layer and the second passivation layer 108, and is in electrical contact with the surface of the second doped portions 104. The antireflection layer has a high refractive index and can reduce reflection loss on the back surface of the cell. The material of the antireflection layer may be silicon nitride or silicon oxynitride, or a combination of both.

The following provides a detailed description of the specific structural configuration of each isolation trench 105.

Figure 6:
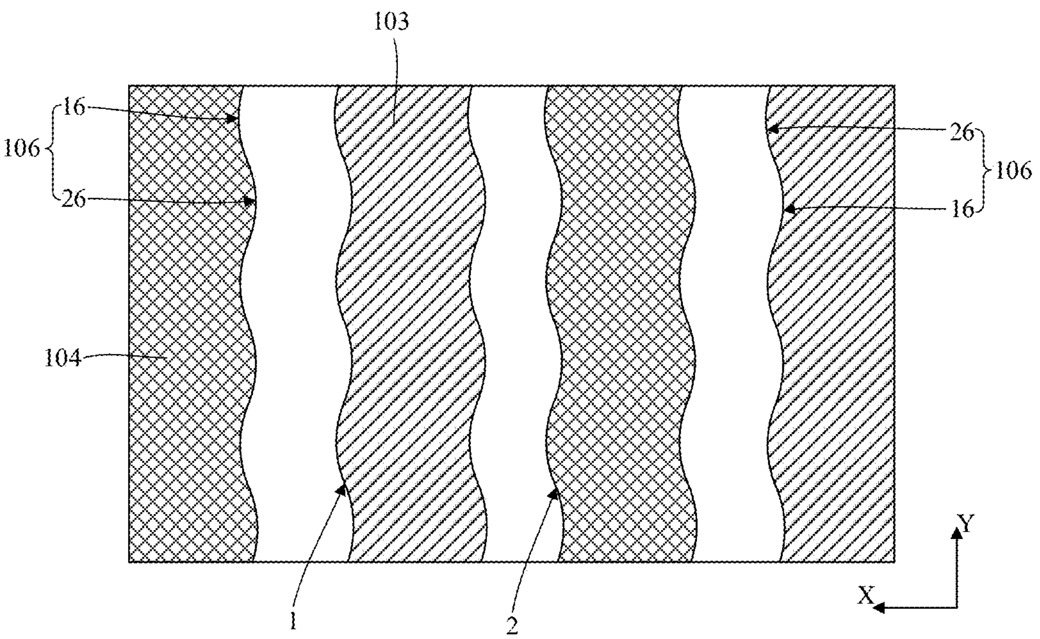
FIG. 6 shows a top view of a fifth type of solar cell provided in an embodiment of the present disclosure.

Referring to FIG. 1, one of the first sidewall 1 and the second sidewall 2 has the corrugated structure 106 extending along the second direction Y. Referring to FIG. 6, FIG. 6 shows a top view of a fifth type of solar cell provided in an embodiment of the present disclosure. The first sidewall 1 and the second sidewall 2 each have the corrugated structure 106 extending along the second direction Y. With the above configuration, the surface areas of the first sidewall 1 and the second sidewall 2 are increased, thereby improving the absorption rate of incident light by the solar cell. Moreover, the first sidewall 1 and the second sidewall 2 with larger surface areas can also increase the contact area between the second passivation layer 108 and the first doped portions 103, as well as the contact area between the second passivation layer 108 and the second doped portions 104, thus improving the passivation effect of the second passivation layer 108 on the first doped portions 103 and the second doped portions 104.

Referring to FIG. 1 and FIG. 6, the corrugated structure 106 includes grooves 16 and ridges 26 alternating along the second direction Y. A respective ridge 26 of the ridges 26 abuts on two adjacent grooves 16 of the grooves 16. The following is described with the first sidewall 1 being the sidewall of the first doped portion 103 and having the corrugated structure 106 as an example. The groove 16 refers to a recess recessed towards the interior of the corresponding first doped portion 103, and the ridge 26 refers to a protrusion protruding away from the corresponding first doped portion 103. One ridge 26 is distributed between two adjacent grooves 16.

A tangent line 10 of the ridge 26 extending along a direction perpendicular to the second direction includes an angle a of 45° to 90° with the first direction (as shown in FIG. 2 and FIG. 3). For example, the included angle a may be 45°, 50.9°, 63.7°, 71.5°, 88.4°, or 90°. It should be noted that the AA1 direction is perpendicular to the second direction, and the AA1 direction penetrates through the groove of the first sidewall. In other words, the tangent line 10 shown in FIG. 2 to FIG. 3 coincides with a profile of the corresponding sidewall of the isolation trench in the figures.

The included angle a may be greater than or equal to 45° and less than 90°. Compared to an included angle a of 90°, an included angle a greater than or equal to 45° and less than 90° is more conducive to increasing the surface area of the sidewall corresponding to the corrugated structure 106, thereby increasing the contact area between the second passivation layer 108 and the first doped portion 103 or second doped portion 104 having the sidewall of the corrugated structure 106. The increased contact area improves the passivation effect of the second passivation layer 108 on the first doped portion 103 or second doped portion 104, thereby improving the photoelectric conversion efficiency of the solar cell.

The included angle a can range from 45° to 90°. In some embodiments, the angle between the tangent line 10 of the ridge 26 of the first sidewall 1 and the bottom surface of each isolation trench 105 can be defined as angle a. That is, the angle between the tangent line 10 and the bottom surface of the first doped portion 103 is obtuse or right.

Referring to FIG. 3, in some embodiments, the first sidewall 1 is the sidewall of the first doped portion 103. The angle between the tangent line 10 of the ridge 26 of the first sidewall 1 and the bottom surface of the first doped portion 103 can be defined as angle a ranging from 45° to 90°. Compared to an acute angle, an obtuse angle or right angle between the tangent line 10 and the bottom surface of each isolation trench 105 is more advantageous for the second passivation layer 108 to cover the side wall of each isolation trench 105 in a conformal manner, reducing the difficulty of forming the second passivation layer 108.

The reason for the angle a being within this angle range may be as follows. Taking processing the second doped portion adjacent to the first doped portion 103 with laser to form the isolation trench 105 as an example, after the laser treatment, due to the limitations of the device used for the laser treatment, there are issues with the energy uniformity of the emitted laser and the regulation of parameters such as laser scan angles when the scanning of the second doped portion 104 is to be started and terminated. These issues may cause the corrugated structure 106 to extend away from the thickness direction of the substrate 100.

In some embodiments, an included angle between a tangent line of the groove 16 extending along a direction perpendicular to the second direction Y and the first direction X may also range from 45° to 90°. That is, the entirety of the corrugated structure 106 is inclined relative to the plane where the first direction X and the second direction Y lie. It should be noted that FIG. 3 to FIG. 5 accordingly show the cross-sectional views of the solar cell along the thickness direction of the substrate. In other words, the tangent lines shown in FIG. 3 to FIG. 5 coincide with the profile of the sidewall of the isolation trench in the corresponding figures.

It should be noted that the specific setting of the angle between the tangent line of the groove 16 extending along a direction perpendicular to the second direction Y and the first direction X can be referred to the aforementioned description of the included angle a, and will not be repeated hereinafter.

The corrugated structure 106 has a maximum width in the first direction X that is less than or equal to 15 μm. For example, the maximum width may be 0.48 μm, 1 μm, 3.2 μm, 4.9 μm, 6.7 μm, 7.8 μm, 8.5 μm, 10.3 μm, 11.7 μm, 12.4 μm, 13.6 μm, 14.7 μm, or 15 μm. Within this range, the width of the corrugated structure 106 along the first direction X is not unduly large, so that the corrugated structure 106 has a moderate undulation along the first direction X, and an average width of the first doped portion 103 or the second doped portion 104 corresponding to the sidewall of the isolation trench 105 where the corrugated structure 106 is located is not unduly small.

It should be noted that within the same corrugated structure 106, along the first direction X, the point on the ridge 26 that is furthest from the corresponding point on the adjacent groove 16 is defined as first point, and the point on the groove 16 that is furthest from the corresponding point on the adjacent ridge 26 is defined as second point. The maximum width refers to the distance between the first point and the second point along the first direction X.

Referring to FIG. 5, at least one of the first sidewall 1 and the second sidewall 2 is correspondingly transitioned to a top surface of the first doped portion 103 or a top surface of the second doped portion 104 with a rounded corner 111. As shown in FIG. 5, the first sidewall 1 is the sidewall of the first doped portion 103, and the second sidewall 2 is the sidewall of the second doped portion 104. As compared to the configuration that the first sidewall 1 transitions to the top surface of the corresponding first doped portion 103 via a sharp corner and the second sidewall 2 is transitioned to the top surface of the corresponding second doped portion 104 via a sharp corner, the transition via the rounded corner 111 imposes less stringent precision requirements for the process of forming the isolation trench 105. This is because the rounded corner 111 exhibits a smooth rather than stepped morphology. The smooth morphology is advantageous for improving the quality of the second passivation layer 108 deposited at the rounded corner 111.

It should be noted that in FIG. 5, the first sidewall 1 and the second sidewall 2 are respectively transitioned to the top surface of the corresponding first doped portion 103 and the top surface of the second doped portion 104 with the rounded corner. In some embodiments, one of the first sidewall 1 and the second sidewall 2 transitions to the top surface of the corresponding first doped portion 103 or the top surface of the corresponding second doped portion 104 via the rounded corner 111, and the other transitions to the top surface of the corresponding first doped portion 103 or the top surface of the corresponding second doped portion 104 via the sharp corner.

The shape of the rounded corner 111 sectioned along the thickness direction of the substrate 100 and the first direction X presents as a smooth line. For example, the shape of the rounded corner 111 sectioned along the thickness direction of the substrate 100 and the first direction X presents as an arc.

A ratio of a height L1 of the rounded corner 111 along the thickness direction of the substrate 100 to a height L2 of the first sidewall 1 along the thickness direction of the substrate 100 is greater than 0 and not greater than 0.15. For example, the ratio may be 0.03, 0.07, 0.11, 0.13, 0.14, or 0.15. The ratio within this range can avoid an unduly large radius of curvature of the rounded corner, so that neither the first doped portion 103 nor the second doped portion 104 is excessively removed during the formation of the rounded corner 111, ensuring desirable performance of the solar cell.

It should be noted that, in the thickness direction of the substrate 100, the point on the rounded corner 111 that is furthest from the second surface 102 is defined as third point. The part of the first sidewall 1 other than rounded corner 111 is defined as sub-sidewall. The part of the rounded corner 111 connected to the corresponding sub-sidewall is defined as connection portion. The height L1 of the rounded corner 111 refers to a distance between the third point and the connection portion in the thickness direction of the substrate 100. The height L2 of the first sidewall 1 refers to a distance between the third point and the bottom surface of the corresponding isolation trench 105 in the thickness direction of the substrate 100.

In some embodiments, the height L1 of the rounded corner 111 may be greater than zero and not greater than 4.8 μm. For example, the height L1 may be 0.74 μm, 1.54 μm, 1.88 μm, 2.12 μm, 2.78 μm, 3.53 μm, 4.39 μm, or 4.8 μm. The height L2 of the first sidewall 1 may range from 1 μm to 32 μm. For example, the height L2 may be 1 μm, 4.54 μm, 7.98 μm, 13.12 μm, 18.58 μm, 23.57 μm, 27.39 μm, 31.13 μm, or 32 μm.

Figure 7:
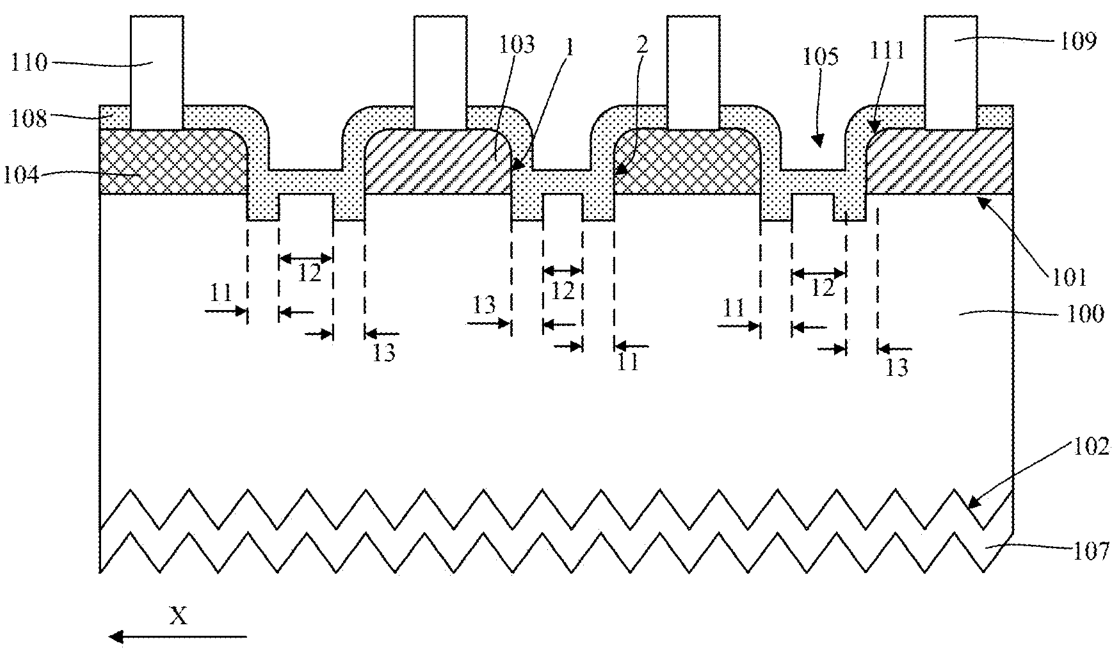
FIG. 7 shows a structural view of a sixth type of solar cell provided in an embodiment of the present disclosure.

FIG. 7 shows a structural view of a sixth type of solar cell provided in an embodiment of the present disclosure.

Referring to FIG. 7, the bottom surface of the isolation trench 105 includes a first region 11, a second region 12, and a third region 13 disposed sequentially along the first direction X. In the thickness direction of the substrate 100, a distance between the bottom surface of the isolation trench 105 corresponding to the first region 11 and the second surface 102 is defined as a first distance, a distance between the bottom surface of the isolation trench 105 corresponding to the second region 12 and the second surface 102 is defined as a second distance, and a distance between the bottom surface of the isolation trench 105 corresponding to the third region 13 and the second surface 102 is defined as a third distance, where the second distance is less than both the first distance and the third distance. The first region 11 is located adjacent to the second doped portion 104 relative to the second region 12, while the third region 13 is located adjacent to the first doped portion 103 relative to the second region 12.

In other words, in the first direction X, the depth of the central region of the isolation trench 105 is relatively small, while the depth of the regions on two sides, along the first direction X, of the central region of the isolation trench 105 is greater. Such configuration can reduce the residuals of the first doped portion 103 or the second doped portion 104 that should be removed during the operation of forming the isolation trench 105, thereby minimizing the possibility of forming a leakage channel between the first doped portion 103 and the second doped portion 104. For example, the method for forming the isolation trench 105 includes: Firstly forming a plurality of first doped portions 103 and a plurality of second doped portions, where along the first direction X, the plurality of second doped portions 104 are in contact with the plurality of first doped portions 103; then removing a part of each of the plurality of second doped portions 104 adjacent to a respective one of the plurality of first doped portions 103 to form an isolation trench 105; and further etching along the removed part of each of the plurality of second doped portions to remove a part of the substrate 100 to form the first region 11 and the third region 13, which can reduce the residual of the second doped portion in the first region 11 and the third region 13.

Accordingly, another embodiment of the present disclosure further provides a manufacturing method for a solar cell. The solar cell provided in the aforementioned embodiments of the present disclosure can be manufactured using the manufacturing method for the solar cell provided in another embodiment of the present disclosure. The following provides a detailed description of the manufacturing method for the solar cell provided in another embodiment of the present disclosure in conjunction with the accompanying drawings. For parts that are identical or corresponding to those in the previous embodiments, reference may be made to the corresponding descriptions of the aforementioned embodiments, and further elaboration will not be provided here.

FIG. 8 to FIG. 16 show structural views corresponding to the operations of the manufacturing method for the solar cell provided in another embodiment of the present disclosure.

Figure 8:
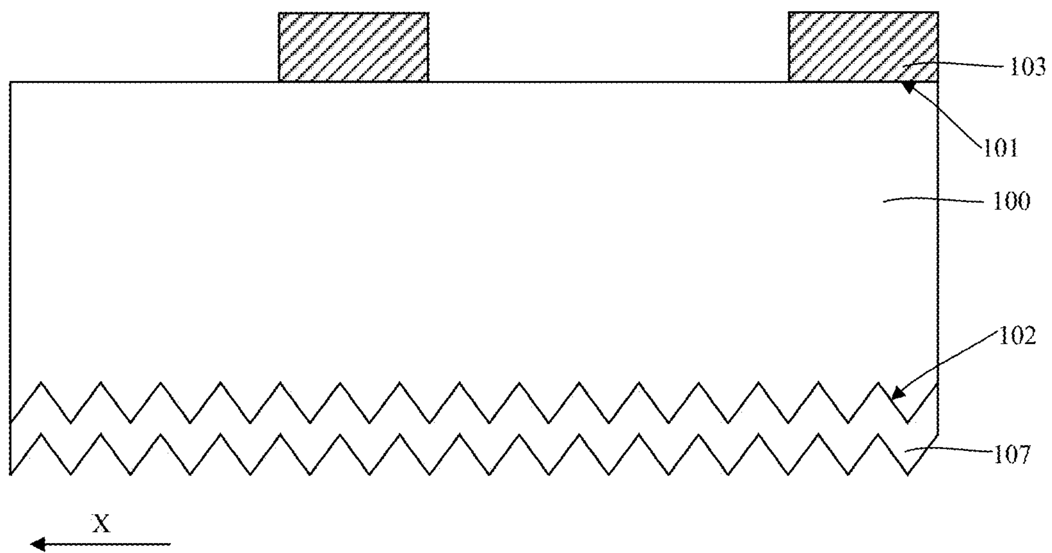
FIG. 8 shows a structural view corresponding to the operation of providing a substrate in a manufacturing method for a solar cell as provided in another embodiment of the present disclosure.

FIG. 8 shows a structural view corresponding to the operation of providing a substrate in the manufacturing method for the solar cell as provided in another embodiment of the present disclosure. It should be noted that FIG. 8 to FIG. 16 illustrate the manufacturing method for the solar cell in which the bottom surface of the first doped portions is flush with the bottom surface of the second doped portions. The embodiments of the present disclosure do not specifically limit the positional relationship of the first doped portions and the second doped portions along the thickness direction of the substrate. The manufacturing method for the solar cell provided in the embodiments of the present disclosure can also be used to manufacture a solar cell in which the bottom surface of each of the first doped portions facing the substrate is higher than the top surface of any of the second doped portions facing away from the substrate in the thickness direction of the substrate.

Referring to FIG. 8, a substrate 100 is provided, where the substrate 100 has a first surface 101 and a second surface 102 opposite to the first surface 101. A plurality of first doped portions 103 distributed at intervals along a first direction X are formed on the first surface 101.

It should be noted that the material settings of the substrate 100 and the first doped portions 103 can be referred to the aforementioned embodiments, and will not be further elaborated below.

Both the second surface 102 and the first surface 101 of the substrate 100 may be of a textured structure or a polished surface structure.

In the embodiments of the present disclosure, the first surface 101 corresponding to the first doped portions 103 may be flush with the first surface 101 not covered by the first doped portions 103.

In some embodiments, the distance between the first surface corresponding to the first doped portions and the second surface is defined as the first distance. The first distance may be greater than the distance between the first surface not covered by the first doped portions and the second surface. For example, the method for forming the first doped portions may include: providing an initial substrate, where the initial substrate has a third surface and a fourth surface opposite to the third surface, and the third surface of the initial substrate is doped for a certain thickness to form initial first doped portions; texturing the initial first doped portions to form the plurality of first doped portions, with the remaining initial substrate serving as the substrate; where a surface of the substrate away from the first doped portions serves as the second surface, that is, the fourth surface of the initial substrate serves as the second surface of the substrate, a surface of the substrate in contact with the first doped portions serves as the first surface, and the first surface of the substrate undulates along the thickness direction of the substrate, where the first distance may be greater than the distance between the first surface not covered by the first doped portions and the second surface.

Figure 9:
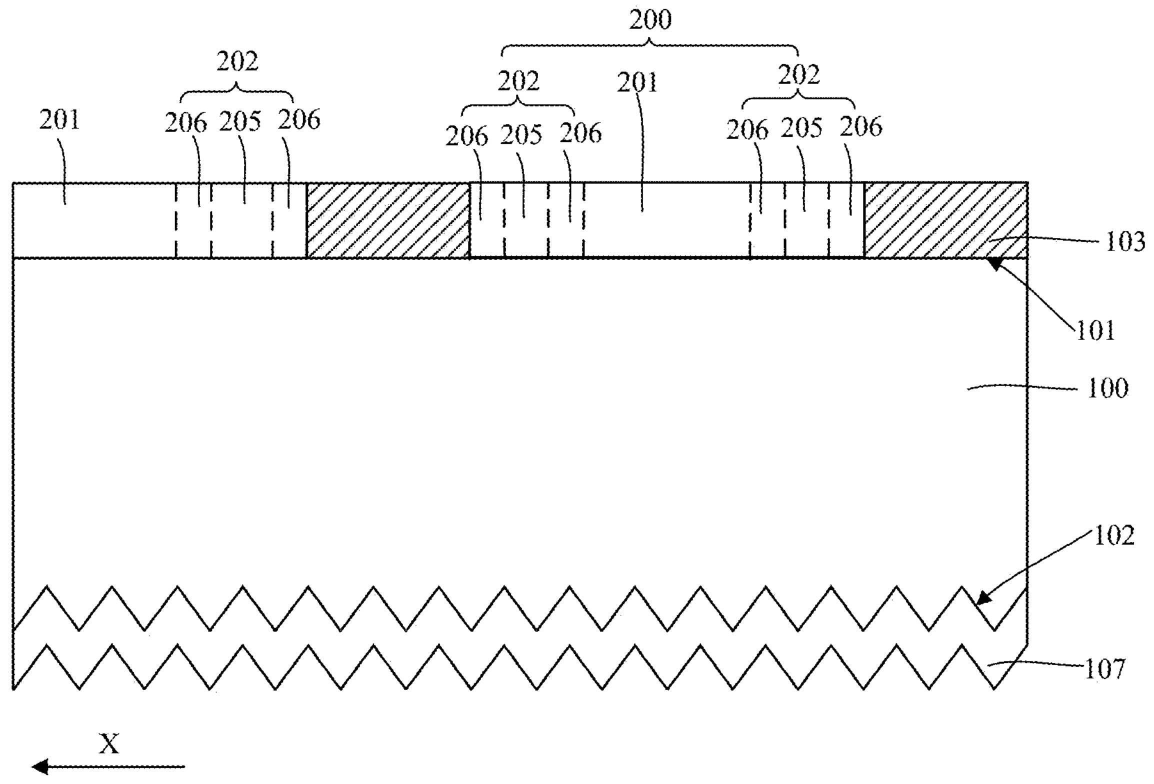
FIG. 9 shows a structural view corresponding to the operation of forming an initial second doped portion in the manufacturing method for the solar cell provided in another embodiment of the present disclosure.

FIG. 9 shows a structural view corresponding to the operation of forming an initial second doped portion in the manufacturing method for the solar cell provided in another embodiment of the present disclosure.

Referring to FIG. 9, a plurality of initial second doped portions 200 distributed at intervals along the first direction X are formed on the first surface 101, where each of the plurality of initial second doped portions 200 includes a first sub-doped portion 201 and a second sub-doped portion 202, the second sub-doped portion 202 is located on two opposite sides of the first sub-doped portion 201 along the first direction X, and is located between a respective one of the plurality of first doped portions 103 and the first sub-doped portion 201, and doping elements in the plurality of initial second doped portions 200 and doping elements in the plurality of first doped portions 103 are of different types.

The initial second doped portions 200 are used to form the second doped portions 104. The initial second doped portions 200 may be doped with P-type doping elements or N-type doping elements. For example, the initial second doped portions 200 may be doped with P-type doping elements, and correspondingly, the first doped portions 103 may be doped with N-type doping elements. For example, the initial second doped portions 200 may be doped with N-type doping elements, and correspondingly, the first doped portions 103 may be doped with P-type doping elements.

A front surface field (not shown) may be formed on the second surface 102 of substrate 100. The concentration of the doping elements in the front surface field is greater than that in the substrate 100, thereby reducing the concentration of minority carriers of the surface with the field passivation effect, decreasing the surface recombination velocity, reducing the series resistance and improving the electron transport capability.

In some embodiments, after the formation of the front surface field, a first passivation layer 107 may be formed on a surface, facing away from the substrate 100, of the front surface field. The first passivation layer 107 functions to passivate the second surface 102 of the substrate 100. The process for forming the first passivation layer 107 may include atomic layer deposition or PECVD.

Figure 10:
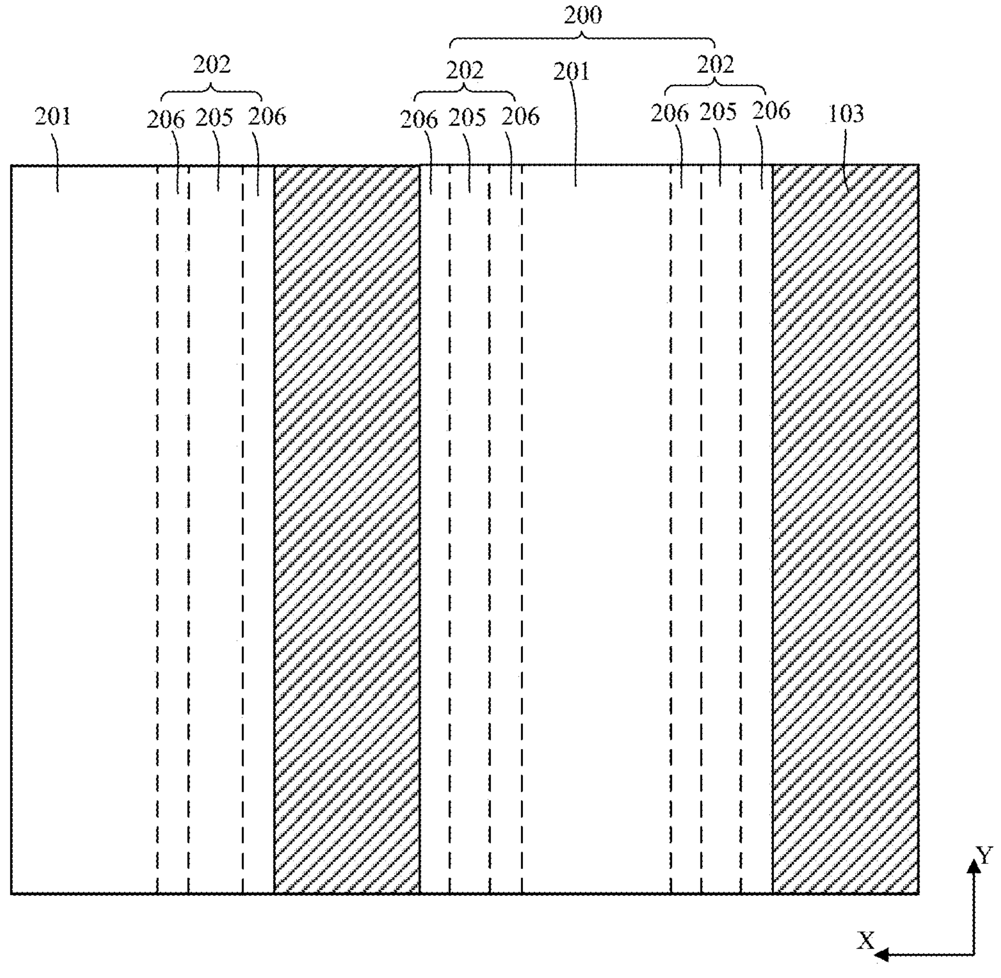
FIG. 10 show a top view corresponding to the operation of forming the initial second doped portion in the manufacturing method for the solar cell provided in another embodiment of the present disclosure.
Figure 11:
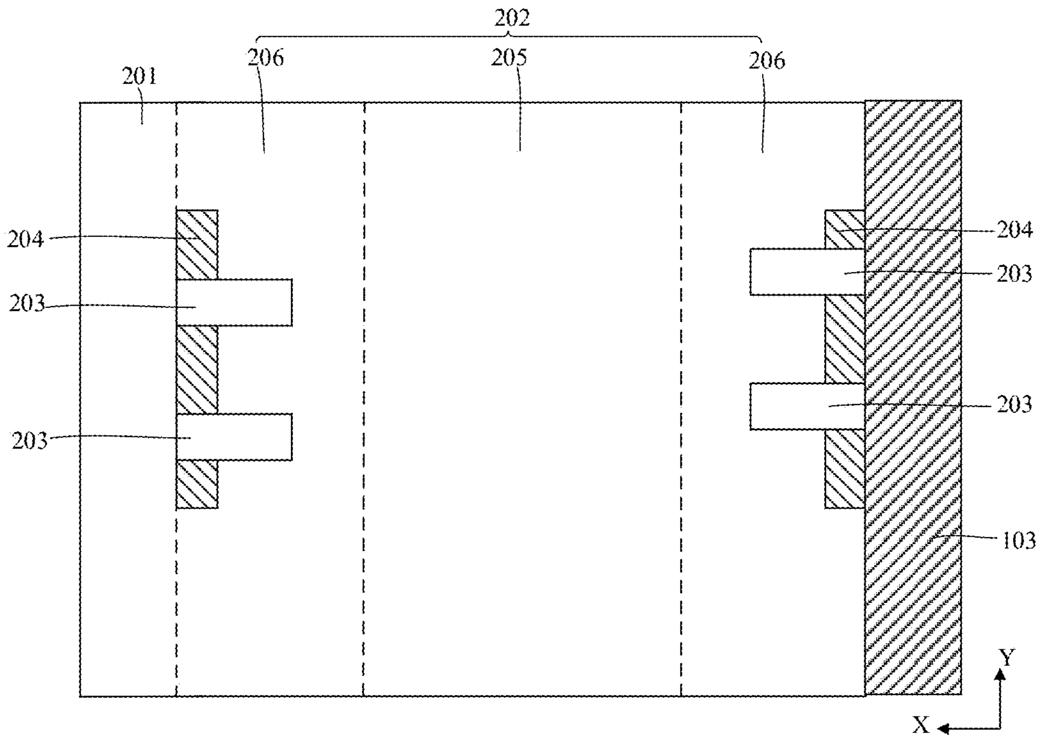
FIG. 11 shows a schematic view of light spots of first and second laser beams respectively projected onto the solar cell provided in laser treatment of the manufacturing method for the solar cell provided in another embodiment of the present disclosure.
Figure 12:
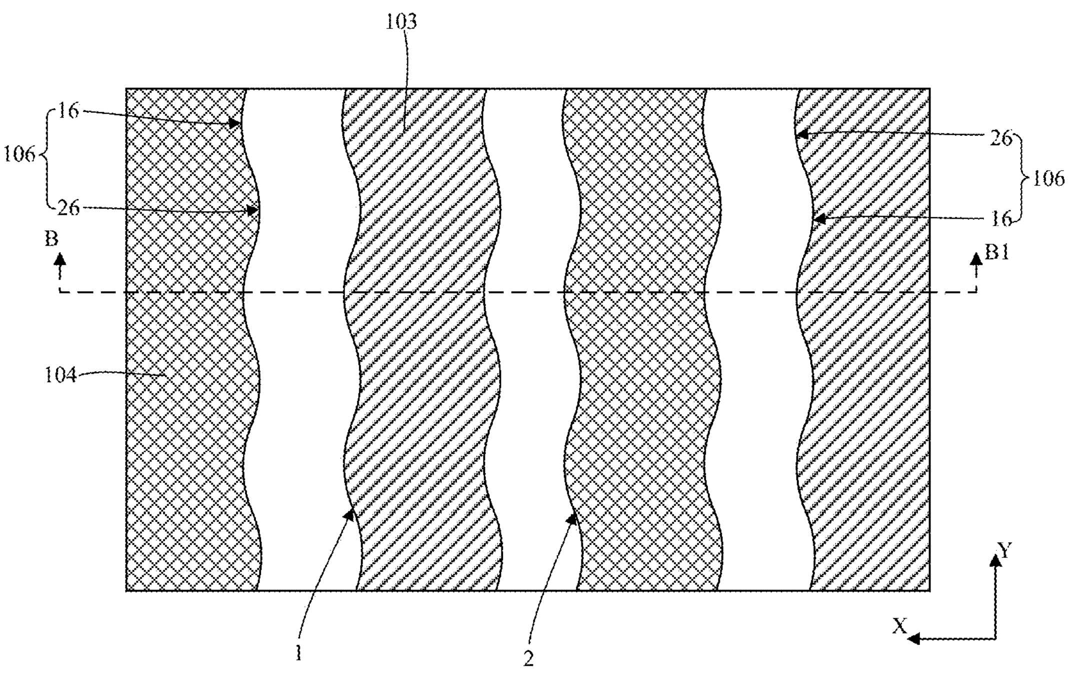
FIG. 12 shows a top view corresponding to the operation of forming a second doped portion in the manufacturing method for the solar cell provided in another embodiment of the present disclosure.
Figure 13:
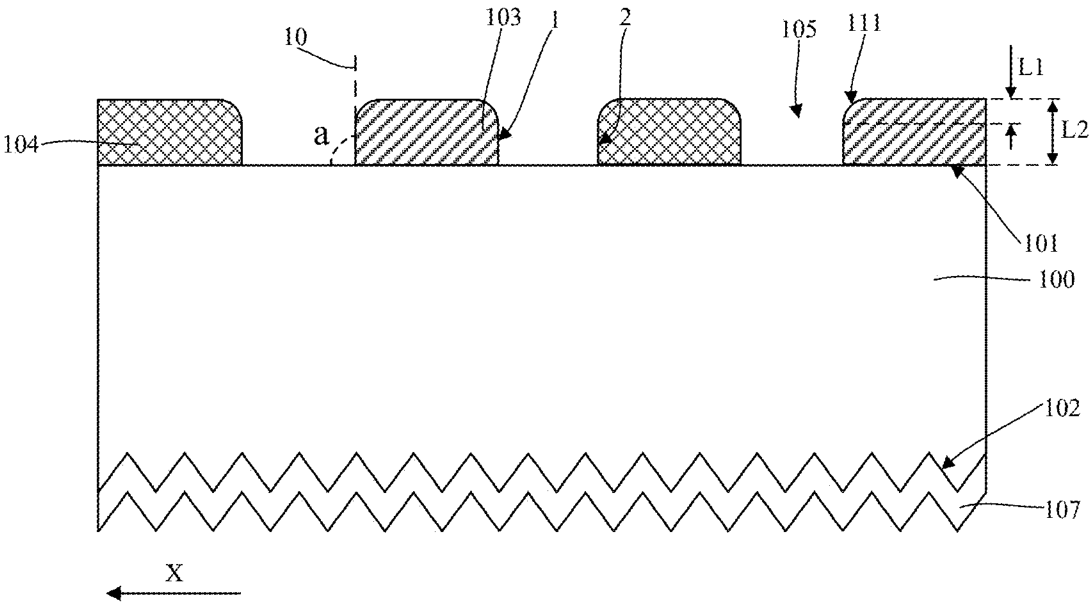
FIG. 13 shows a cross-sectional view of the solar cell sectioned along line BB1 in FIG. 12.

FIG. 10 show a top view corresponding to the operation of forming the initial second doped portion in the manufacturing method for the solar cell provided in another embodiment of the present disclosure. FIG. 11 shows a schematic view of light spots of first and second laser beams respectively projected onto the solar cell provided in laser treatment of the manufacturing method for the solar cell provided in another embodiment of the present disclosure. FIG. 12 shows a top view corresponding to the operation of forming the second doped portion in the manufacturing method for the solar cell provided in another embodiment of the present disclosure. FIG. 13 shows a cross-sectional view of the solar cell sectioned along line BB1 in FIG. 12. In FIG. 11, the reference sign 203 represents a light spot of a first laser beam projected onto the solar cell, and the reference sign 204 represents a light spot of a second laser beam projected onto the solar cell. FIG. 11 further shows an enlarged top view of the initial second doped portion shown in FIG. 10.

Referring to FIG. 12 to FIG. 13, laser treatment is performed on each of the plurality of initial second doped portions 200 to remove at least the second sub-doped portion 202 and form an isolation trench 105 between the remaining first sub-doped portion 201 and an adjacent one of the plurality of first doped portions 103, where the isolation trench 105 exposes the first surface 101, and the remaining first sub-doped portion 201 serves as the second doped portion 104, where the isolation trench 105 has opposing first sidewall 1 and second sidewall 2 that extend along a second direction, and at least one of the first sidewall 1 and the second sidewall 2 has a corrugated structure 106 that undulates while extending along the second direction Y. It should be noted that FIG. 12 shows an embodiment in which the first sidewall 1 has the corrugated structure 106 and the first sidewall 1 is a sidewall of the first doped portion 103.

Referring to FIG. 11, the laser treatment includes: scanning a top surface of the plurality of second sub-doped portions 202 with a plurality of first laser beams and a plurality of second laser beams, where the plurality of first laser beams are used for scanning the top surface of the corresponding plurality of second sub-doped portions 202 in the first direction, and the plurality of second laser beams are used for scanning a preset region in the second direction Y, where the preset region at least includes a part of the top surface of the corresponding plurality of first doped portions 103 adjacent to the plurality of second sub-doped portions 202 in the plurality of initial second doped portions 200, and the second direction Y is parallel to a side surface of each of the plurality of second sub-doped portions 202 facing the respective one of the plurality of first doped portions 103.

It will be appreciated that, due to the limitations inherent in the laser device used for laser treatment or usage environment, the energy of the laser emitted by the laser device when the laser device is to be started and terminated, may be lower than that of the laser emitted after the laser device has been in use for a period of time. The related technique commonly adopts a plurality of laser beams extending along the first direction X to scan the initial second doped portions 200 for forming the isolation trench 105. Given the aforementioned issues, the energy of the plurality of laser beams is weaker at the beginning and end of the scanning on the solar cell, which may easily result in residuals of the initial second doped portions 200 along the opposite sidewalls of the isolation trench 105 in the first direction X.

In the manufacturing method for the solar cell provided in this embodiment, second laser beams are applied to a part of the top surface of the second sub-doped portion adjacent to the corresponding first doped portion 103. The part of the top surface of the second sub-doped portion 202 adjacent to the corresponding first doped portion 103 corresponds to an initial or final period of the first laser beams scanning the second sub-doped portion 202. That is, the second laser beams can compensate for the insufficient energy when the first laser beams just start to scan the second sub-doped portion 202, or can compensate for the insufficient energy when the first laser beams are about to stop scanning the second sub-doped portion, Therefore, the residue of the initial second doped portion 200 in forming the isolation trench 105 is reduced, and the possibility of forming a leakage channel between the first doped portion 103 and the second doped portion 104 is reduced, which is advantageous for improving the yield rate and performance of solar cells.

The power of the first laser beam may range from 25 W to 35 W. For example, the power of the first laser beam may be 25 W, 27.3 W, 28.5 W, 30.7 W, 32.4 W, 33.5 W, 34.8 W, or 35 W. The power of the second laser beam may range from 25 W to 35 W. For example, the power of the second laser beam may be 25 W, 26.4 W, 27.5 W, 29.7 W, 31.4 W, 33.2 W, 34.8 W, or 35 W. Setting the power of the first laser beam and the power of the second laser beam to be within the aforementioned ranges can ensure that the combined power of the first laser beam and the second laser beam is not excessively high, and further avoid excessive etching of the substrate 100 corresponding to the preset region. Further, the above configuration can ensure the power of the second laser beam is relatively high, so that the total power of the first laser beam and the second laser beam used for scanning the preset region is not excessively low. This ensures a more uniform energy distribution of the laser beams used to scan various regions of the second sub-doped portion 202, which in turn facilitates the reduction of residuals of the initial second doped portion 200.

A duration for the plurality of first laser beams to scan the top surface of the corresponding plurality of second sub-doped portions 202 in the first direction X is defined as first processing time, a duration for the plurality of second laser beams to scan the preset region in the second direction Y is defined as second processing time, and a ratio of the first processing time to the second processing time ranges from 1 to 70. For example, the ratio of the first processing time to the second processing time may be 1, 8.2, 13.4, 18.9, 25.4, 36.7, 42.5, 48.9, 53.8, 59.2, 63.4, 68.7, or 70. The ratio within this range can ensure that the second sub-doped portion 202 is well removed from the preset region.

In some embodiments, the first processing time may range from 5 s to 35 s. For example, the first processing time may be 5 s, 6.8 s, 8.6 s, 11.2 s, 17.8 s, 23.5 s, 28.7 s, 30.5 s, 32.6 s, 34.8 s, or 35 s. The second processing time may range from 0.5 s to 5 s. For example, the second processing time may be 0.5 s, 1.2 s, 1.7 s, 2.6 s, 3.2 s, 3.8 s, 4.5 s, 4.7 s, or 5 s.

During the laser treatment, a plurality of first laser beams are used for scanning the top surface of the corresponding plurality of second sub-doped portions 202 in the first direction X. Light spots of adjacent first laser beams projected onto the top surface of the corresponding plurality of second sub-doped portions 202 partially overlap with each other. This configuration solves the problem of uneven energy distribution between the edge and central regions of the light spot of the first laser beams, and achieves the uniform energy distribution of the plurality of first laser beams for scanning the second sub-doped portions 202. This configuration also reduces residuals of the second sub-doped portions 202 while preventing damage to the substrate 100 caused by excessive laser beam energy in certain regions.

It should be noted that the embodiments of the present disclosure do not specifically limit the number of the first and second laser beams. For example, the number of the first laser beams used for scanning the same initial second doped portion 200 may be 1, 3, 4, or 5, and the number of the second laser beams used for scanning the same initial second doped portion 200 may be 1, 2, 4, or 6.

In some embodiments, the preset region may include the top surface of the corresponding first doped portion 103 adjacent to the second sub-doped portion 202 in the initial second doped portion 200. Consequently, during the laser treatment, one of the first sidewall 1 and the second sidewall 2 of the formed isolation trench 105 has the corrugated structure 106 extending in the second direction Y, while the other is a flat surface without undulations (see FIG. 1). Referring to FIG. 11, each of the plurality of second sub-doped portions 202 includes a first portion 205 and two second portions 206 respectively located on two opposite sides of the first portion 205 along the first direction X, and the preset region includes the top surface of the two second portions 206 in a respective one of the plurality of initial second doped regions 200. The first sidewall 1 and the second sidewall 2 of the isolation trench 105 formed in the laser treatment each have the corrugated structure 106 extending along the second direction Y.

Referring to FIG. 12 and FIG. 13, in some embodiments, the corrugated structure 106 includes grooves 16 and ridges 26 alternating along the second direction Y. A respective ridge 26 of the ridges 26 abuts on two adjacent grooves 16 of the grooves 16. A tangent line 10 of the ridge 26 extending along a direction perpendicular to the second direction Y includes an angle a of 45° to 90° with the first direction. For example, the included angle a may be 45°, 50.9°, 63.7°, 71.5°, 88.4°, or 90°.

The angle between the tangent line 10 of the ridge 26 of the first sidewall 1 and the bottom surface of the isolation trench 105 can be defined as angle a. That is, the angle between the tangent line 10 and the bottom surface of the first doped portion 103 is obtuse or right. The second passivation layer 108 is formed in the subsequent operation to cover the isolation trench 105.

In some embodiments, referring to FIG. 13, the first sidewall 1 is the sidewall of the first doped portion 103, and the angle between the tangent line 10 of the ridge 26 of the first sidewall 1 and the bottom surface of the first doped portion 103 may be the angle a. Such configuration in which the angle a is acute or right, as compared to the configuration in which the angle between the tangent line 10 and the bottom surface of the first doped portion 103 is obtuse, is more favorable for the second passivation layer 108 to conformally cover the sidewalls of the isolation trench 105, reducing the difficulty in forming the second passivation layer 108.

An included angle between a tangent line of the groove 16 extending along a direction perpendicular to the second direction Y and the first direction X may also range from 45° to 90°. That is, the entirety of the corrugated structure 106 is inclined relative to the plane where the first direction X and the second direction Y lie.

It should be noted that the BB1 direction is perpendicular to the second direction Y. Therefore, the tangent line 10 in FIG. 13 coincides with a profile of the corresponding sidewall of the isolation trench. In addition, the specific setting of the angle between the tangent line of the groove extending along a direction perpendicular to the second direction Y and the first direction X can be referred to the aforementioned description of the included angle a, and will not be repeated hereinafter.

Referring to FIG. 13, at least one of the first sidewall 1 and the second sidewall 2 is correspondingly transitioned to a top surface of the first doped portion 103 or a top surface of the second doped portion 104 with a rounded corner 111. As shown in FIG. 13, the first sidewall 1 is the sidewall of the first doped portion 103, and the second sidewall 2 is the sidewall of the second doped portion 104. As compared to the configuration that the first sidewall 1 transitions to the top surface of the first doped portion 103 via a sharp corner and the second sidewall 2 transitions to the top surface of the second doped portion 104 via a sharp corner, the transition via the rounded corner 111 imposes less stringent precision requirements for the process of forming the isolation trench 105. This is because the rounded corner 111 exhibits a smooth rather than stepped morphology. The smooth morphology is advantageous for improving the quality of the second passivation layer deposited at the rounded corner. The transition with rounded corner can be achieved by adjusting the power and scanning angle of the first and second laser beams.

The laser treatment may include a first laser treatment and a second laser treatment which are sequentially executed. During the first laser treatment, at least two first laser beams scan the preset region along the first direction X, and at least one second laser beam scans the preset region along the second direction Y, a light spot of the at least two first laser beams projected onto the preset region is defined as first light spot, and a light spot of the at least one second laser beam projected onto the preset region is defined as second light spot, where an overlapping part of the first and second light spots is used for removing a corresponding part of the second sub-doped portion of the preset region and for removing a part of the first doped portion 103 adjacent to the preset region, to form the grooves, and a part of the first light spot that does not overlap with the second light spot is used for removing the corresponding second sub-doped portion 202, to form the ridges; during the second laser treatment, a plurality of first laser beams are used for scanning the top surface of the remaining second sub-doped portion 202, so as to remove the remaining second sub-doped portion 202 and form the isolation trench 105.

In other words, the energy of the overlapping part of the first laser beam and the second laser beam is greater than that of the part of the first laser beam that does not overlap with the second laser beam, so as to remove the second sub-doped portion 202 more completely. Further, the first doped portion 103 adjacent to the part of the second sub-doped portion 202 is also removed by virtue of the thermal effect of laser. The energy in the part of the first light spot that does not overlap with the second light spot is relatively low. Therefore, the part of the first light spot that does not overlap with the second light spot can only be utilized to remove the second sub-doped portion 202. Even if the part of the first light spot that does not overlap with the second light spot can remove the first doped portion 103 adjacent to the second sub-doped portion 202, the amount of the removed first doped portion 103 is less than that removed by the overlapping part of the first light spot and the second light spot, thereby forming the ridge 26.

The preset region is the top surface of the corresponding first doped portion 103 adjacent to one second sub-doped portion 202 in the initial second doped portion 200. The first sidewall 1 has the corrugated structure 106, while the second sidewall 2 is a flat surface without undulations.

In some embodiments, referring to FIG. 10, each of the plurality of second sub-doped portions 202 includes a first portion 205 and two second portions 206 respectively located on two opposite sides of the first portion 205 along the first direction, and the preset region includes the top surface of the two second portions 206 in a respective one of the plurality of initial second doped regions 200. Referring to FIG. 11 and FIG. 12, during the first laser treatment, at least two first laser beams respectively scan the top surface of the two second portions 206 in the initial second doped portion 200, where an overlapping part of the second light spot corresponding to one second laser beam and the first light spot is used for removing the corresponding second portion 206 and for removing a part of the first doped portion 103 adjacent to the second portion 206, to form the groove 16, and an overlapping part of the second light spot corresponding to the other second laser beam and the first light spot is used for removing the other second portion 206 and for removing the first sub-doped portion 201 adjacent to the other second portion 206, to form another groove 16. Consequently, the first sidewall 1 and the second sidewall 2 each have the corrugated structure 106.

In some embodiments, the shapes of the light spots of the first and second laser beams projected onto the initial second doped portion may be rectangular or circular. The embodiments of the present disclosure do not specifically limit the shapes of the light spots of the first and second laser beams projected onto the initial second doped portion.

Figure 14:
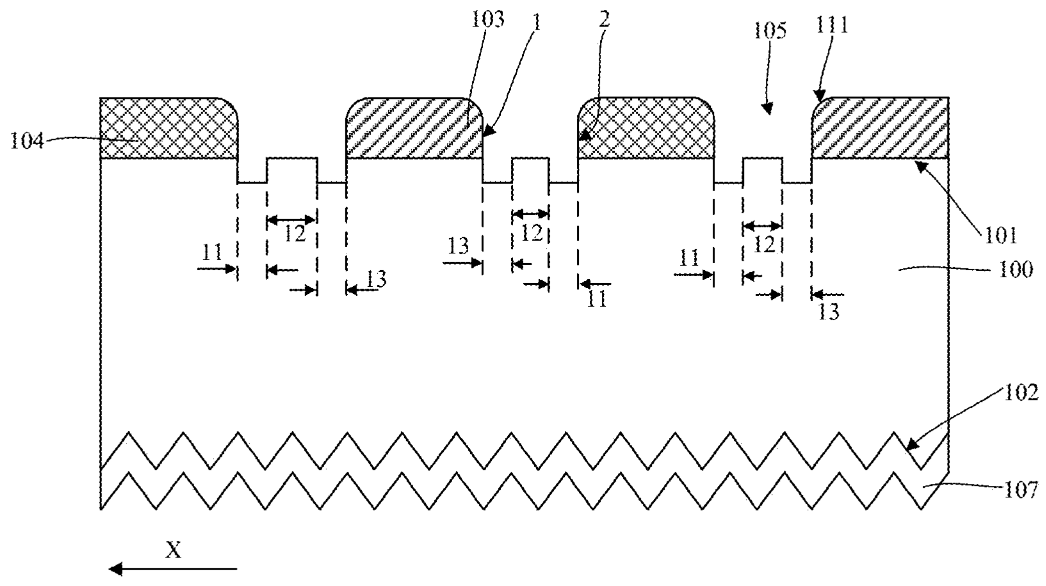
FIG. 14 shows another structural view corresponding to the operation of forming the initial second doped portion in the manufacturing method for the solar cell provided in another embodiment of the present disclosure.

FIG. 14 shows another structural view corresponding to the operation of forming the initial second doped portion 200 in the manufacturing method for the solar cell provided in another embodiment of the present disclosure.

Referring to FIG. 10, each of the plurality of second sub-doped portions 202 includes a first portion 205 and two second portions 206 respectively located on two opposite sides of the first portion 205 along the first direction X. Referring to FIG. 14, the laser treatment includes: removing the first portion 205, the second portions 206, and a part of the substrate 100 corresponding to the bottom surface of the first portion 205, to form the isolation trench 105 including the first region 11, the second region 12, and the third region 13; where the first region 11, the second region 12, and the third region 13 are disposed sequentially along the first direction X, and in the thickness direction of the substrate 100, a second distance is less than a first distance and a second distance is less than a third distance; wherein the first distance is a distance between the bottom surface of the isolation trench 105 corresponding to the first region 11 and the second surface, the second distance is a distance between the bottom surface of the isolation trench 105 corresponding to the second region 12 and the second surface 102, and the third distance is a distance between the bottom surface of the isolation trench 105 corresponding to the third region 13 and the second surface 102. Such configuration can reduce the residuals of the second portion 206 during the laser treatment, thereby minimizing the possibility of forming a leakage channel between the first doped portion 103 and the second doped portion 104.

Figure 15:
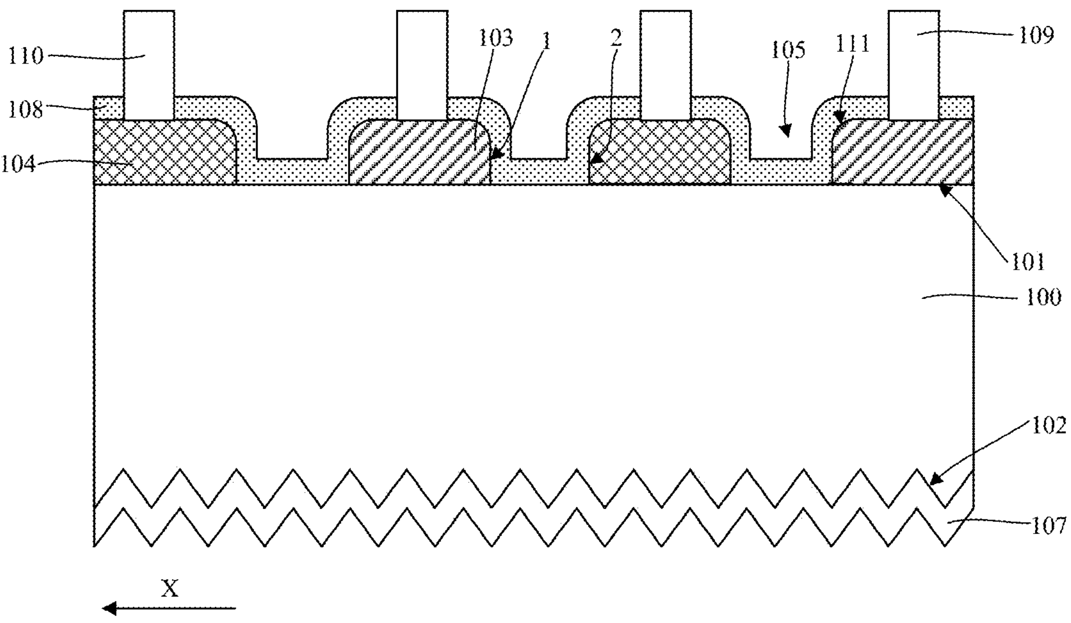
FIG. 15 shows a structural view corresponding to the operation of forming a first electrode and a second electrode in the manufacturing method for the solar cell provided in another embodiment of the present disclosure.
Figure 16:
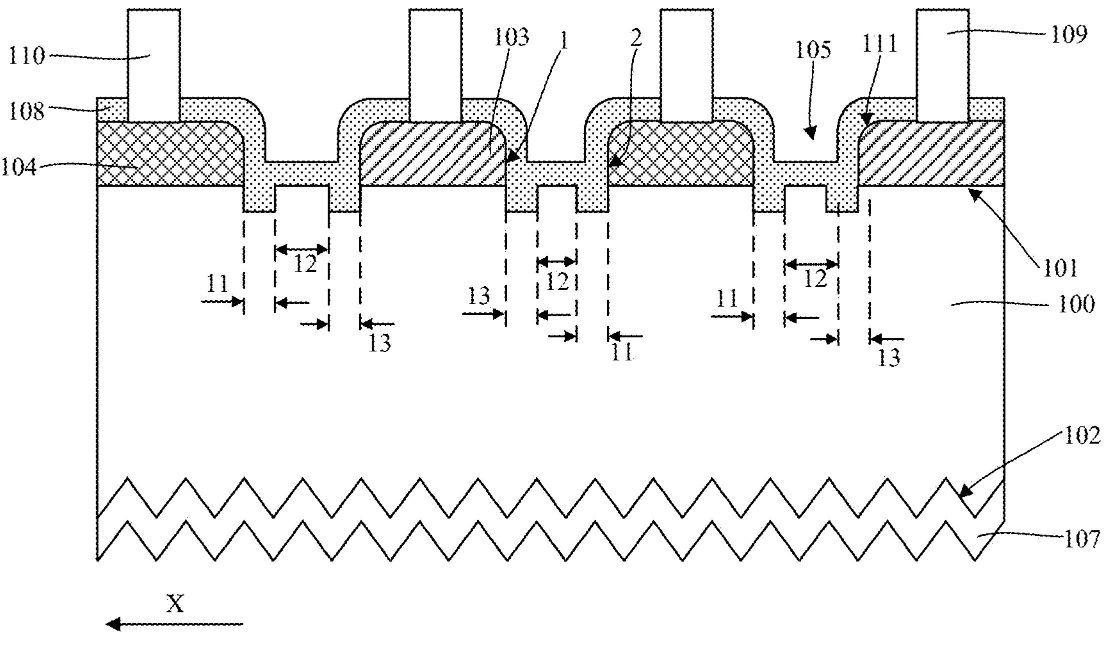
FIG. 16 shows another structural view corresponding to the operation of forming the first electrode and the second electrode in the manufacturing method for the solar cell provided in another embodiment of the present disclosure.

FIG. 15 shows a structural view corresponding to the operation of forming a first electrode and a second electrode in the manufacturing method for the solar cell provided in another embodiment of the present disclosure. FIG. 16 shows another structural view corresponding to the operation of forming the first electrode and the second electrode in the manufacturing method for the solar cell provided in another embodiment of the present disclosure. The structure in FIG. 15 can be formed by the solar cell shown in FIG. 13 through the sequential operations of forming a second passivation layer, a first electrode, and a second electrode. Similarly, the structure in FIG. 16 can be formed by the solar cell shown in FIG. 14 through the sequential operations of forming a second passivation layer, a first electrode, and a second electrode.

As shown in FIG. 15 and FIG. 16, a second passivation layer 108 is formed; and a first electrode 109 and a second electrode 110 are formed. The first electrode 109 penetrates through the second passivation layer 108 to establish electrical contact with the first doped portion 103. The second electrode 110 penetrates through the second passivation layer 108 to establish electrical contact with the second doped portion 104.

Figure 17:
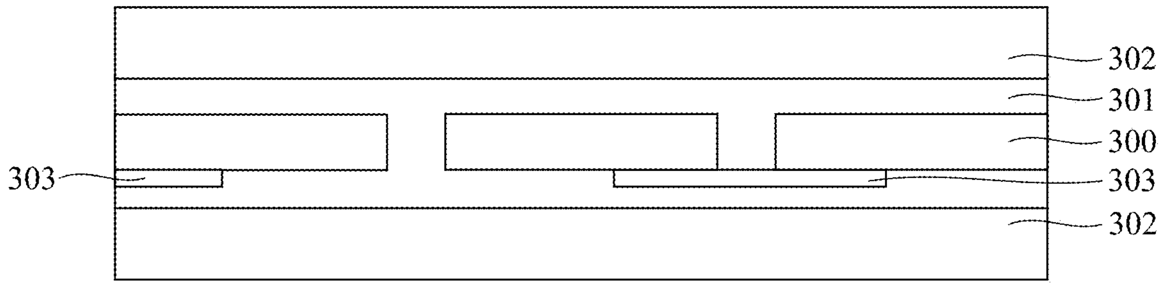
FIG. 17 shows a structural view of a photovoltaic module provided in another embodiment of the present disclosure.

Correspondingly, some embodiments of the present disclosure further provide a photovoltaic module. Referring to FIG. 17, FIG. 17 shows a structural view of a photovoltaic module provided in another embodiment of the present disclosure. The photovoltaic module includes: a cell string formed by connecting a plurality of solar cells 300, where the solar cell 300 is the solar cell provided according to the precedent embodiments or the solar cell manufactured by the manufacturing method provided according to the precedent embodiments; an encapsulation layer 301, configured for covering a surface of the cell string; and a cover plate 302, configured for covering a surface of the encapsulation layer 301 facing away from the cell string. The solar cells 300 are electrically connected in either a monolithic or multi-segmented form to forming a plurality of cell strings. The plurality of cell strings are electrically connected in series and/or parallel.

Specifically, in some embodiments, the plurality of cell strings are electrically connected through conductive tapes 303. The solar cell provided by the embodiments of the present disclosure is an IBC cell. The solar cell includes the first electrode 109 and the second electrode 110 located on the same side of the solar cell (see FIG. 4). The first electrode and the second electrode have different polarities, and the conductive tape connects two adjacent solar cells on the same side.

In some embodiments, there are no gaps provided between solar cells, that is, the solar cells overlap one another.

In some embodiments, the encapsulation layer includes a first encapsulation layer and a second encapsulation layer. The first encapsulation layer covers one of the front surface and the back surface of the solar cell, while the second encapsulation layer covers the other. Specifically, at least one of the first encapsulation layer and the second encapsulation layer may be an organic encapsulation layer such as polyvinyl butyral (PVB) film, ethylene-vinyl acetate copolymer (EVA) film, polyethylene octene elastomer (POE) film, or polyethylene terephthalate (PET) film.

It will be appreciated that the first encapsulation layer and the second encapsulation layer have a boundary before lamination. After the lamination process, the boundary between the first encapsulation layer and the second encapsulation layer of the photovoltaic module no longer exists, as the first encapsulation layer and the second encapsulation layer have become an integral encapsulation layer.

In some embodiments, the cover plate 302 may be a glass cover plate, a plastic cover plate, or any other cover plate with a light-transmitting function. Specifically, a surface, facing towards the encapsulation layer 301, of the cover plate 302 may be uneven, thereby enhancing the utilization rate of incident light. The cover plate includes a first cover plate and a second cover plate. The first cover plate opposes the first encapsulation layer, and the second cover plate opposes the second encapsulation layer.

Those of ordinary skill in the art can understand that the aforementioned embodiments are specific examples for implementing the present disclosure. In practical applications, various modifications can be made to them in form and detail without deviating from the spirit and scope of the present disclosure. A person skilled in the art may make various alterations and modifications without departing from the spirit and scope of the present disclosure, and thus the scope of protection of the present disclosure should be determined by the scope of the appended claims.

What is claimed is:

1. A solar cell, comprising:

a substrate, having a first surface and a second surface opposite to the first surface;

a plurality of first doped portions, on the first surface;

a plurality of second doped portions on the first surface, wherein the plurality of second doped portions and the plurality of first doped portions are alternatingly distributed on the first surface along a first direction, and doping elements in the plurality of first doped portions are of a first type and doping elements in the plurality of second doped portions are of a second type different from the first type; and a plurality of isolation trenches, wherein a respective isolation trench of the plurality of isolation trenches is formed between a respective first doped portion of the plurality of first doped portions and an adjacent second doped portion of the plurality of second doped portions, wherein the respective isolation trench has opposing first sidewall and second sidewall that extend along a second direction, at least one of the first sidewall and the second sidewall has a corrugated structure that undulates while extending along the second direction, and the second direction intersects with the first direction, wherein at least one of the first sidewall and the second sidewall transitions to a top surface of the respective first doped portion or a top surface of the adjacent second doped portion via a rounded corner, wherein a ratio of a height of the rounded corner along a thickness direction of the substrate to a height of the first sidewall along the thickness direction of the substrate is less than or equal to 3:20.

2. The solar cell according to claim 1, wherein the corrugated structure has a maximum width in the first direction that is less than or equal to 15 μm.

3. The solar cell according to claim 1, wherein the corrugated structure includes grooves and ridges alternating along the second direction; and a tangent line of one of the ridges extending along a direction perpendicular to the second direction includes an angle of 45° to 90° with the first direction.

4. The solar cell according to claim 1, wherein each of the plurality of isolation trenches has a bottom surface, the bottom surface includes a first region, a second region, and a third region disposed sequentially along the first direction;

wherein in a thickness direction of the substrate, a second distance is less than a first distance and a second distance is less than a third distance; wherein the first distance is a distance between the bottom surface of each of the plurality of isolation trenches corresponding to the first region and the second surface, the second distance is a distance between the bottom surface of each of the plurality of isolation trenches corresponding to the second region and the second surface, and the third distance is a distance between the bottom surface of each of the plurality of isolation trenches corresponding to the third region and the second surface.

5. The solar cell according to claim 1, wherein the first sidewall and the second sidewall each have the corrugated structure extending along the second direction.

6. The solar cell according to claim 1, wherein a bottom of each of the plurality of first doped portions facing the substrate is higher than a top of any of the plurality of second doped portions facing away from the substrate.

7. The solar cell according to claim 1, further comprising a first passivation layer over the plurality of first doped portions and the plurality of second doped portions and covering the first side wall, the second side wall and a bottom surface of the isolation trench.

8. The solar cell according to claim 7, further comprising a first electrode penetrating through the first passivation layer and electrically connected to the plurality of first doped portions; and a second electrode penetrating through the first passivation layer and electrically connected to the plurality of second doped portions.

9. The solar cell according to claim 1, further comprising a first passivation layer located on the second surface.

10. The solar cell according to claim 1, wherein the first surface of the substrate is a polished surface.

11. The solar cell according to claim 1, wherein the second surface of the substrate has a textured structure.

12. A photovoltaic module, comprising:

at least one cell string, formed by connecting a plurality of solar cells according to claim 1;

at least one encapsulation layer, each configured for covering a surface of the at least one cell string; and at least one cover plate, each configured for covering a surface of the at least one encapsulation layer facing away from the at least one cell string, wherein the at least one encapsulation layer includes a first encapsulation layer and a second encapsulation layer, the first encapsulation layer covers one of a front surface and a back surface of the at least one cell string, and the second encapsulation layer covers the other.

13. The photovoltaic module according to claim 12, wherein a maximum width of the corrugated structure in the first direction is less than or equal to 15 μm.

14. The photovoltaic module according to claim 12, wherein the corrugated structure includes grooves and ridges alternating along the second direction; and a tangent line of one of the ridges extending along a direction perpendicular to the second direction includes an angle of 45° to 90° with the first direction.

15. The photovoltaic module according to claim 12, wherein the plurality of isolation trenches each have a bottom surface, the bottom surface includes a first region, a second region, and a third region disposed sequentially along the first direction;

wherein in a thickness direction of the substrate, a second distance is less than a first distance and a second distance is less than a third distance; wherein the first distance is a distance between the bottom surface of each the plurality of isolation trenches corresponding to the first region and the second surface, the second distance is a distance between the bottom surface of each the plurality of isolation trenches corresponding to the second region and the second surface, and the third distance is a distance between the bottom surface of each the plurality of isolation trenches corresponding to the third region and the second surface.

16. The photovoltaic module according to claim 12, wherein the first sidewall and the second sidewall each have the corrugated structure extending along the second direction.

* * * * *